United States Patent
Abe et al.

(10) Patent No.: US 9,358,781 B2
(45) Date of Patent: Jun. 7, 2016

(54) LIQUID DISCHARGING APPARATUS, HEAD UNIT, AND CONTROL METHOD OF LIQUID DISCHARGING APPARATUS

(71) Applicant: Seiko Epson Corporation, Tokyo (JP)

(72) Inventors: Akira Abe, Matsumoto (JP); Hiroshi Sugita, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/626,394

(22) Filed: Feb. 19, 2015

(65) Prior Publication Data

US 2015/0246532 A1    Sep. 3, 2015

(30) Foreign Application Priority Data

Mar. 3, 2014   (JP) ................................. 2014-040408

(51) Int. Cl.
| | |
|---|---|
| B41J 29/38 | (2006.01) |
| B41J 2/045 | (2006.01) |
| B41J 2/14 | (2006.01) |

(52) U.S. Cl.
CPC .......... *B41J 2/04541* (2013.01); *B41J 2/04581* (2013.01); *B41J 2/04588* (2013.01); *B41J 2/04593* (2013.01); *B41J 2/04596* (2013.01); *B41J 2002/14491* (2013.01)

(58) Field of Classification Search
CPC .......................... B41J 2/04541; B41J 2/04586
USPC ................ 347/10, 44, 5, 9; 361/527; 336/212
See application file for complete search history.

(56) References Cited

U.S. PATENT DOCUMENTS

| | | | |
|---|---|---|---|
| 4,959,754 A | * | 9/1990 | Stufler et al. .................. 361/527 |
| 2007/0152795 A1 | * | 7/2007 | Zeng .................... H01F 27/2804 336/212 |
| 2009/0206888 A1 | | 8/2009 | Kitazawa et al. |
| 2012/0120136 A1 | * | 5/2012 | Oshima et al. .................. 347/10 |

FOREIGN PATENT DOCUMENTS

| | | |
|---|---|---|
| JP | 2009-190287 A | 8/2009 |
| JP | 2010-114711 A | 5/2010 |
| JP | 2010-114811 A | 5/2010 |

\* cited by examiner

*Primary Examiner* — Lam Nguyen
(74) *Attorney, Agent, or Firm* — Harness, Dickey & Pierce, P.L.C.

(57) ABSTRACT

Provided is a liquid discharging apparatus which includes a modulation circuit which generates a modulation signal which is obtained by pulse-modulating a source signal, a transistor which generates an amplified modulation signal by amplifying the modulation signal, a low pass filter which includes an inductor and a capacitor and generates a drive signal by smoothening the amplified modulation signal, a piezoelectric element which is displaced by receiving the drive signal, a cavity of which the internal volume changes in accordance with the displacement of the piezoelectric element, a nozzle through which liquid in the cavity is discharged in accordance with change in the internal volume of the cavity, and a circuit substrate on which the modulation circuit, the transistor, and the low pass filter are mounted, in which the capacitor is a leadless type capacitor.

7 Claims, 19 Drawing Sheets

<DECODER DECODING CONTENTS>

| PRINT DATA Data | T1 | | T2 | |
|---|---|---|---|---|
| | Sa | Sb | Sa | Sb |
| (1, 1) | H | L | H | L |
| (0, 1) | H | L | L | H |
| (1, 0) | L | L | L | H |
| (0, 0) | L | H | L | L |

MSB  LSB

<SECOND LAYER>

FIG. 14 <THIRD LAYER>

<FOURTH LAYER>

<PIN ASSIGNMENT OF LSI>

LIQUID DISCHARGING APPARATUS, HEAD UNIT, AND CONTROL METHOD OF LIQUID DISCHARGING APPARATUS

The entire disclosure of Japanese Patent Application No. 2014-040408, filed Mar. 3, 2014 is expressly incorporated by reference herein.

BACKGROUND

1. Technical Field

The present invention relates to a liquid discharging apparatus, a head unit, and a control method of the liquid discharging apparatus.

2. Related Art

An ink jet printer having piezoelectric elements has been known as an ink jet printer which prints an image or a document by discharging ink. In a head unit, the piezoelectric elements are provided respectively corresponding to a plurality of nozzles. The respective piezoelectric elements are driven in accordance with drive signals, in such a manner that a predetermined amount of ink (liquid) is discharged from the nozzles at a predetermined time. As a result, dots are formed. In an electrical point of view, the piezoelectric element is a capacitive load, such as a capacitor. Thus, when a piezoelectric element corresponding to each nozzle is operated, it is necessary to supply an adequate amount of current to the piezoelectric element.

Therefore, a drive signal amplified by an amplifier circuit is supplied to the head unit, in such a manner that the piezoelectric element is driven. An example of the amplifier circuit includes an amplifier circuit of a type in which a source signal not subjected to amplification is subjected to, for example, class AB current-amplification (in other words, linear amplification) (see JPA-2009-190287). However, in the case of linear amplification, electric power consumption is large and energy efficiency is not good. Accordingly, in recent years, a configuration in which a source signal is subjected to class D amplification has been proposed (see JP-A-2010-114711).

Meanwhile, in recent years, there has been a high demand for high-speed printing and high-resolution printing of a printing apparatus. To perform high-speed printing, the number of dots formed for each unit time may be increased. To perform high-resolution printing, the number of dots formed for each unit area may be increased in a state where the amount of discharged ink from nozzles is set to be small. In other words, to perform high-speed and high-resolution printing, the number of dots formed for each unit time and unit area may be increased. Thus, a method in which an ink discharge frequency is increased is used.

Meanwhile, to increase an ink discharge frequency, it is necessary to increase the frequency of a drive signal supplied to a piezoelectric element. To perform a stable discharge operation in a state where the frequency of a drive signal is increased and the influence by, for example, residual oscillation, is reduced, it is necessary to increase the switching frequency of class D amplification.

However, when the switching frequency is increased, the loss due to switching is increased. Accordingly, the energy efficiency in class D amplification is reduced to be below the energy efficiency in linear amplification. As a result, it is not possible to ensure high energy efficiency which is an advantage of the class D amplification.

Furthermore, when switching in class D amplification is performed at high frequency, a problem, such as an operational failure due to noise and a heat generation due to switching loss, can occur.

As described above, when the switching frequency of class D amplification is increased to increase the frequency of a drive signal for driving a piezoelectric element, various problems can occur.

SUMMARY

An advantage of some aspects of the invention is that, in a configuration in which a piezoelectric element is driven by a drive signal subjected to class D amplification, a liquid discharging apparatus capable of performing high-speed printing and high-resolution printing, a head unit, and a control method of the liquid discharging apparatus are provided.

According to an aspect of the invention, there is provided a liquid discharging apparatus which includes a modulation circuit which generates a modulation signal which is obtained by pulse-modulating a source signal, a transistor which generates an amplified modulation signal by amplifying the modulation signal, a low pass filter which includes an inductor and a capacitor and generates a drive signal by smoothening the amplified modulation signal, a piezoelectric element which is displaced by receiving the drive signal, a cavity of which the internal volume changes in accordance with the displacement of the piezoelectric element, a nozzle through which liquid in the cavity is discharged in accordance with change in the internal volume of the cavity, and a circuit substrate on which the modulation circuit, the transistor, and the low pass filter are mounted, in which the capacitor is a leadless type capacitor.

In this case, in the capacitor constituting the low pass filter for smoothening the amplified modulation signal, a parasitic inductance is reduced in the transistor, and thus the influence, such as overshoot, by voltage noise is prevented. Accordingly, the modulation signal (in other words, an amplified modulation signal) as a switching signal can have a high frequency. As a result, the frequency of the drive signal applied to the piezoelectric element is increased, in such a manner that high-speed printing and high-resolution printing can be performed.

The leadless type capacitor described above means a capacitor having a configuration in which a lead is not provided. Specific examples of the leadless type capacitor include a chip capacitor and a feed-through capacitor.

A source signal means a signal, in other words, a signal not subjected to modulation, functioning as the source of a drive signal defining displacement of the piezoelectric element. The source signal is a signal functioning as reference of the waveform of the drive signal. The source signal and a defined signal may be analog signals or digital signals. The modulation signal is a digital signal which is obtained by performing pulse-modulation (for example, pulse-width modulation, pulse-density modulation, and the like) on the source signal.

Generally, a low pass filter is constituted of an inductor (for example, a coil) and a capacitor. However, a low pass filter may further include a resistor. Alternatively, a low pass filter may be constituted of a resistor and a capacitor, without an inductor.

Meanwhile, in this case, the drive signal is generated by smoothening the amplified modulation signal and the piezoelectric element is displaced by receiving the drive signal, in such a manner that liquid is discharged from the nozzles. When the waveform of the drive signal which is used for causing the liquid discharging apparatus to discharge, for example, a small-sized dot is frequency-spectrum-analyzed, it is possible to know that a frequency component of which the frequency is equal to or higher than 50 kHz is included in the drive signal. To generate such a drive signal including a frequency component of which the frequency is equal to or higher than 50 kHz, it is necessary to set the frequency of a modulation signal (in other words, an amplified modulation signal) to be equal to or higher than 1 MHz.

When the frequency of the modulation signal is set to be less than 1 MHz, edges of the waveform of a reproduced drive signal are reduced in sharpness, and thus the edges are rounded. In other words, the corner of the waveform is removed, and thus the waveform is rounded. When the waveform of the drive signal is rounded, the displacement of the piezoelectric element which is operated in accordance with ascending/descending edges is reduced. As a result, trail-pulling at the time of discharging or a discharge failure occurs, and thus the printing quality may be reduced.

Meanwhile, when the frequency of the modulation signal is set to be higher than 8 MHz, the resolution of the waveform of the drive signal is increased. However, an increase in the switching frequency of a transistor leads to an increase in switching loss. As a result, low power-consumption properties and low heat-generation properties, which are the superiorities of class D amplification to linear amplification, such as class AB amplification, are deteriorated.

Accordingly, in the liquid discharge apparatus, it is preferable that the frequency of the modulation signal be in the range of 1 MHz to 8 MHz.

In the liquid discharging apparatus, it is preferable that a signal based on the modulation signal, the amplified modulation signal, or the drive signal may be fed back to the modulation circuit, in such a manner that the modulation circuit generates the modulation signal. A drive signal which reproduces, through the feedback, the source signal with fidelity can be output. In this case, the drive signal is a signal which is obtained by smoothening the amplified modulation signal, and thus the voltage amplitude of the drive signal is high. Accordingly, upon comparison between a case where a difference between the drive signal and the source signal is directly calculated and a case where the drive signal is subjected to attenuation, and then a difference between the attenuated drive signal and the source signal is calculated, the latter is preferable. A signal based on the drive signal means not a signal which directly shows the drive signal but a signal which indirectly shows the drive signal, as described above.

The smaller the delay components in the fed-back drive signal are, the higher the frequency of the modulation signal is. The modulation signal (in other words, the amplified modulation signal), in addition to the drive signal, can be used as a feedback signal.

The invention can be realized by various aspects, such as a control method of a liquid discharging apparatus and a head unit.

BRIEF DESCRIPTION OF THE DRAWINGS

The invention will be described with reference to the accompanying drawings, wherein like numbers reference like elements.

FIGS. 22A and 22B are cross-sectional views illustrating the configurations of the transistor and the like.

FIG. 26 is an end view illustrating the mounted state of the capacitor and the like.

DESCRIPTION OF EXEMPLARY EMBODIMENTS

Hereinafter, an embodiment the invention will be described with reference to the accompanying drawings.

A printing apparatus according to this embodiment is an ink jet printer, in other words, a liquid discharging apparatus, in which ink is discharged in accordance with image data supplied from an external host computer and a group of ink dots are formed in a printing medium, such as a paper sheet, in such a manner that the image (which includes letters, graphics, and the like) corresponding to the image data is printed.

Figure 1:
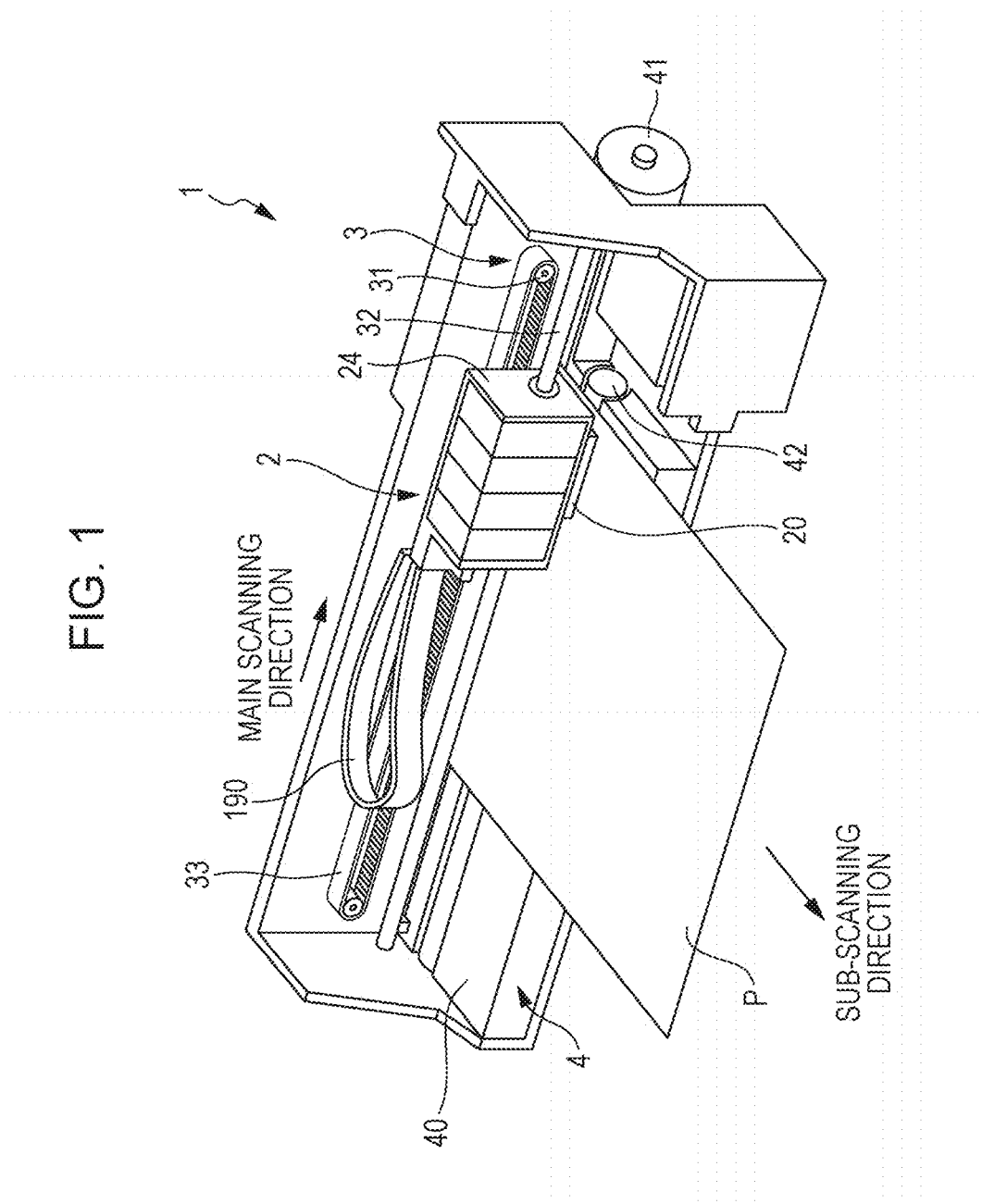
FIG. 1 is a view illustrating the schematic configuration of a printing apparatus.

FIG. 1 is a perspective view illustrating the schematic internal configuration of the printing apparatus.

A printing apparatus 1 includes a movement mechanism 3 which moves (reciprocates) a movable body 2 in a main scanning direction, as illustrated in FIG. 1.

The movement mechanism 3 has a carriage motor 31, a carriage guide shaft 32, and a timing belt 33. The carriage motor 31 functions as a drive source of the movable body 2. Both ends of the carriage guide shaft 32 are fixed. The timing belt 33 extends substantially parallel to the carriage guide shaft 32 and is driven by the carriage motor 31.

A carriage 24 of the movable body 2 is reciprocatably supported by the carriage guide shaft 32. The carriage 24 is fixed to a part of the timing belt 33. Accordingly, when the timing belt 33 is subjected to forward/reverse traveling by the carriage motor 31, the movable body 2 reciprocates in a state where the movable body 2 is guided by the carriage guide shaft 32.

A head unit 20 is provided in a part of the movable body 2, which is a portion facing a printing medium P. The head unit 20 is a member which discharges ink-droplets (liquid-droplets) through a plurality of nozzles, as described below. Various control signals and the likes are supplied to the head unit 20 through a flexible cable 190.

The printing apparatus 1 includes a transport mechanism 4 which transports, on a platen 40, the printing medium P in a sub-scanning direction. The transport mechanism 4 includes a transport motor 41 and a transport roller 42. The transport motor 41 functions as a drive source. The transport roller 42 is rotated by the transport motor 41 and transports the printing medium P in the sub-scanning direction.

When the printing medium P is transported by the transport mechanism 4, the head unit 20 discharges ink-droplets onto the printing medium P, in such a manner that an image is formed on the surface of the printing medium P.

Figure 2:
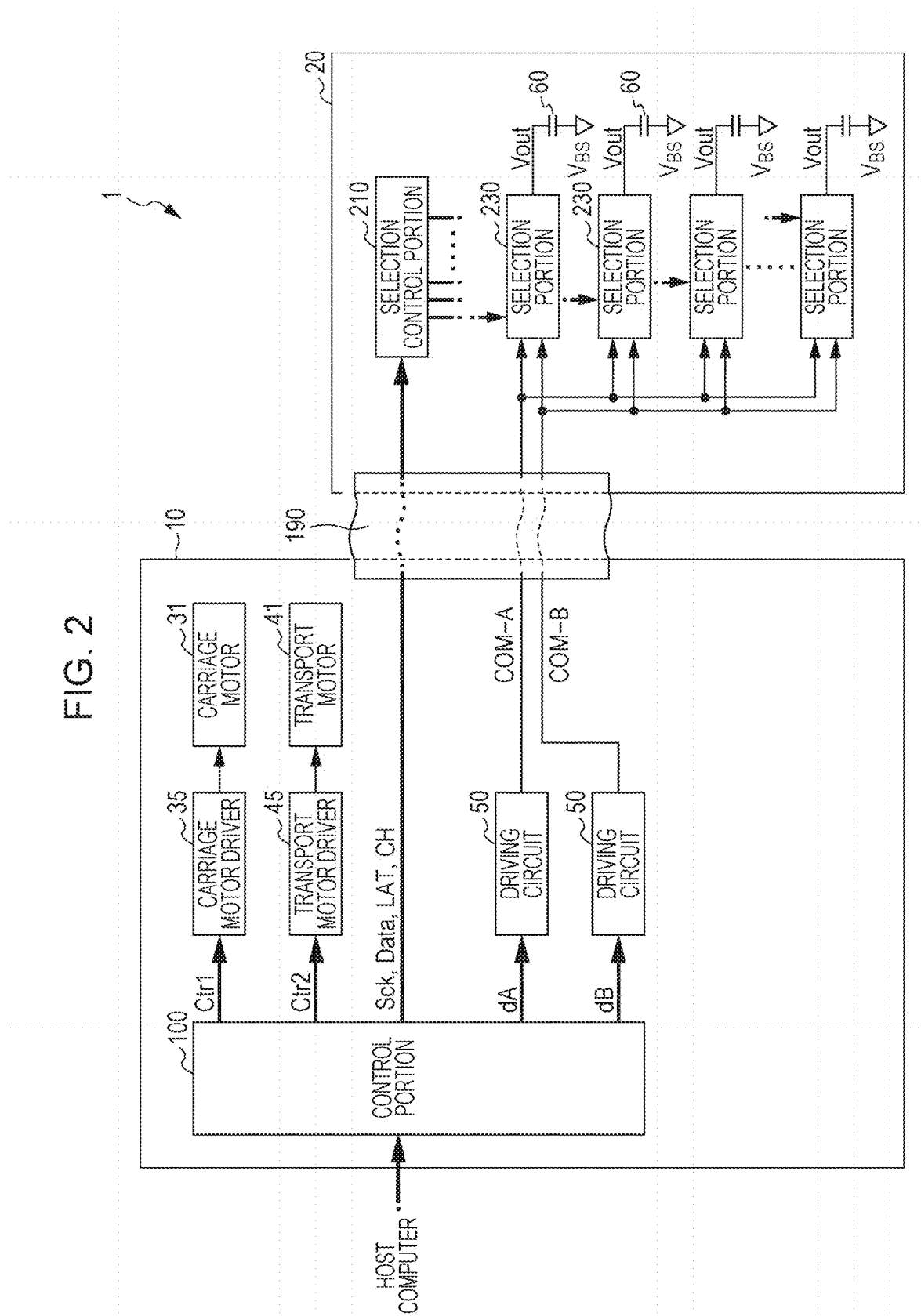
FIG. 2 is a block diagram illustrating the configuration of the printing apparatus.

FIG. 2 is a block diagram illustrating the electrical configuration of the printing apparatus.

In the printing apparatus 1, a control unit 10 and the head unit 20 are connected through the flexible cable 190, as illustrated in FIG. 2.

The control unit 10 has a control portion 100, the carriage motor 31, a carriage motor driver 35, the transport motor 41, a transport motor driver 45, two driving circuits 50, and the head unit 20. When image data is supplied from the host computer, the control portion 100 of the components described above outputs various control signals and the likes, to control the other components.

Specifically, first, the control portion 100 supplies a control signal Ctr1 to the carriage motor driver and the carriage motor driver 35 drives, in accordance with the control signal Ctr1, the carriage motor 31. As a result, the movement of the carriage 24 in the main scanning direction is controlled.

Second, the control portion 100 supplies a control signal Ctr2 to the transport motor driver 45 and the transport motor driver 45 drives, in accordance with the control signal Ctr2, the transport motor 41. As a result, the movement of the transport mechanism 4 in the sub-scanning direction is controlled.

Third, the control portion 100 supplies digital data dA to one of the two driving circuits 50 and supplies digital data dB to the other. In this case, the data dA decides the waveform of drive signal COM-A of drive signals supplied to the head unit 20 and the data dB decides the waveform of a drive signal COM-B thereof.

The one of the driving circuits 50 analog-converts the data dA, and then the driving circuit 50 supplies, to the head unit 20, the drive signal COM-A subjected to class-D amplification. The details of this will be described below. Similarly, the other of the driving circuits 50 analog-converts the data dB, and then the driving circuit 50 supplies, to the head unit 20, the drive signal COM-B subjected to class-D amplification.

Fourth, the control portion 100 supplies, to the head unit 20, a clock signal Sck, a data signal Data, and control signals LAT and CH.

A selection control portion 210 and a plurality of groups, each of which is constituted of a selection portion 230 and a piezoelectric element 60, are provided in the head unit 20.

The selection control portion 210 instructs each selection portion 230 to select either the drive signal COM-A or the drive signal COM-B (or select neither drive signal), in accordance with, for example, a control signal supplied from the control portion 100. Subsequently, the selection portion 230 selects the drive signal COM-A or the drive signal COM-B, in accordance with the instruction from the selection control portion 210. Next, the selection portion 230 supplies the selected signal to one end of the piezoelectric element 60. In the accompanying drawings, the Vout represents the voltage of the drive signal.

In this example, a voltage $V_{BS}$ is applied to the other ends of the respective piezoelectric elements 60, in which the voltage $V_{BS}$ is a common voltage.

The piezoelectric elements 60 are respectively provided corresponding to the plurality of nozzles in the head unit 20. The piezoelectric element 60 is displaced in accordance with the difference between a voltage Vout of the drive signal selected by the selection portion 230 and the voltage $V_{BS}$, in such a manner that the piezoelectric element 60 discharges ink. Next, the configuration for discharging ink by driving the piezoelectric element 60 will be simply described.

Figure 3:
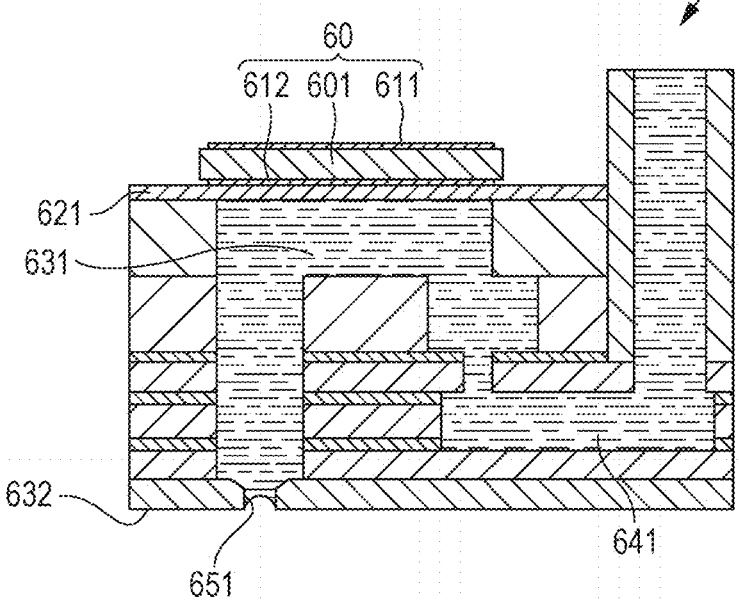
FIG. 3 is a view illustrating the configuration of a discharge portion in a head unit.

FIG. 3 is a view illustrating the schematic configuration of a part of the head unit 20, which corresponds to one nozzle.

The head unit 20 includes the piezoelectric element 60, an oscillation plate 621, a cavity (pressure chamber) 631, a reservoir 641, and a nozzle 651, as illustrated in FIG. 3. Among the components described above, the oscillation plate 621 functions as a diaphragm which is subjected to displacement (in other words, bending oscillation) by the piezoelectric element 60, in such a manner that the oscillation plate 621 expands or contracts the internal volume of the cavity 631 which is filled with ink. In FIG. 3, the piezoelectric element 60 is disposed on the upper surface of the oscillation plate 621. The nozzle 651 is provided in a nozzle plate 632. The nozzle 651 is an opening portion communicating with the cavity 631.

The piezoelectric element 60 illustrated in FIG. 3 has a configuration in which a piezoelectric body 601 is interposed between a pair of electrodes 611 and 612. In the piezoelectric body 601 having the configuration described above, the central portion thereof in FIG. 3, along with the electrodes 611 and 612 and the oscillation plate 621, is bent in a vertical direction with respect to both end portions thereof, in accordance with the voltage applied by the electrodes 611 and 612. Specifically, when the voltage Vout of the drive signal is high, the piezoelectric element is bent upward. In contrast, when the voltage Vout is low, the piezoelectric element 60 is bent downward. In the configuration described above, when the piezoelectric element 60 is bent upward, the internal volume of the cavity 631 expands. Thus, ink is drawn from the reservoir 641. In contrast, when the piezoelectric element 60 is bent downward, the internal volume of the cavity 631 contracts. Thus, when the amount of contraction is adequate, ink is discharged from the nozzle 651.

The configuration of the piezoelectric element 60 is not limited to the configuration illustrated in FIG. 3. Any configuration may be applied to the piezoelectric element 60 as long as the piezoelectric element 60 is deformed, in such a manner that liquid, such as ink, can be discharged. Furthermore, the piezoelectric element 60 is not limited to a bending oscillation type. The piezoelectric element 60 may be a longitudinal oscillation type.

In the head unit 20, the piezoelectric element 60 is provided corresponding to the cavity 631 and the nozzle 651. In FIG. 1, the piezoelectric element 60 is also provided corresponding to the selection portion 230. Accordingly, a group of the piezoelectric element 60, the cavity 631, the nozzle 651, and the selection portion 230 is provided for each nozzle 651.

Figure 4A:
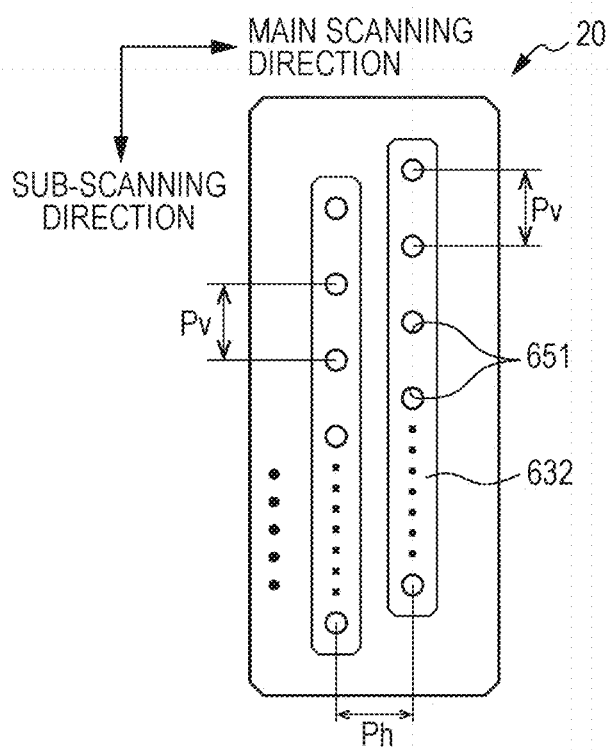
FIGS. 4A and 4B are views illustrating the arrangement of nozzles in the head unit.

FIG. 4A is a view illustrating an example of the arrangement of the nozzles 651.

The nozzles 651 are arranged to be in, for example, two rows, as illustrated in FIG. 4A. Specifically, in one row of the nozzles 651, the plurality of nozzles 651 are arranged in the sub-scanning direction, spaced apart from each other by a pitch Pv. In terms of the two rows of the nozzles 651, the two rows are spaced apart in the main scanning direction, by a pitch Ph. Furthermore, the two rows of the nozzles 651 are staggered by half the pitch Pv.

When color printing is performed, a pattern corresponding to C (cyan), M (magenta), Y (yellow), K (black), or the like is applied to the nozzles 651, along, for example, the main scanning direction. However, to simplify the configuration, a case in which gradation is expressed in a monochromatic manner is described below.

Figure 4B:
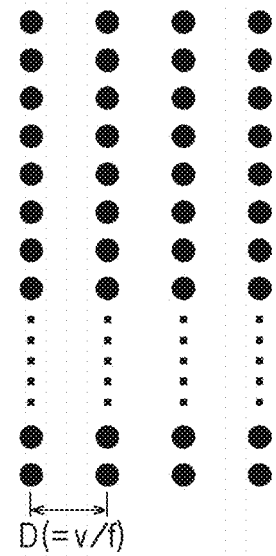

FIG. 4B is an explanatory view of the basic resolution of image formation by the nozzle arrangement illustrated in FIG. 4A. To simplify the description, an example of a method (which will be referred to as a first method) in which one ink-droplet discharge action is performed by each nozzle 651, in such a manner that a dot is formed, is illustrated in FIG. 4B. A black circle represents a dot formed by landing of ink-droplet.

When the head unit 20 moves in the main scanning direction at a velocity v, a (main-scanning-directional) gap D between dots formed by landed ink-droplets and the speed v satisfies the following relationship.

That is, when one dot is formed by one ink-droplet discharge action, the gap D between dots is a value (=v/f) obtained by dividing the speed v by an ink discharge frequency f. In other words, the gap D is a distance by which the head unit 20 moves in a period (1/f) in which ink-droplets are repeatedly discharged.

In the example illustrated in FIGS. 4A and 4B, ink-droplets discharged from the two rows of the nozzles 651 land on the printing medium P, in a state where the ink-droplets are aligned in rows while satisfying the relationship in which the pitch Ph is proportional to the gap D between dots with a coefficient n. Accordingly, a gap between dots in the sub-scanning direction is half a gap between dots in the main scanning direction, as illustrated in FIG. 4B. Needless to say, the arrangement of dots is not limited to the example illustrated in FIG. 4B.

Meanwhile, to achieve high-speed printing, the velocity v at which the head unit 20 moves in the main scanning direction may be simply increased. However, when only the velocity v is increased, the gap D between dots is increased. Thus, to achieve high-speed printing with ensuring a certain degree of resolution, it is necessary to increase the ink discharge frequency f such that the number of dots increases for each unit time.

To increase resolution, the number of dots may be increased for each unit area, apart from the printing speed. However, in a case where the number of dots is increased, when the amount of discharged ink is not small, adjacent dots are combined. Furthermore, when the ink discharge frequency f is not increased, the printing speed is reduced.

To achieve high-speed printing and high-resolution printing, it is necessary to increase the ink discharge frequency f, as described above.

Meanwhile, methods of forming dots on the printing medium P are as follows. In the first method, one ink-droplet discharge action is performed, in such a manner that one dot is formed. In a second method, two or more ink-droplet discharge actions can be performed for each unit time period and two or more ink-droplets discharged in the unit time period land on a printing medium, and then the two or more landed ink-droplets are combined, in such a manner that one dot is formed. In a third method, two or more landed ink-droplets are not combined, in such a manner that two or more dots are formed. In the following description, a case in which dots are formed by the second method will be explained.

In this embodiment, the second method will be described with the assumption explained below. In other words, in this embodiment, when one dot is formed, the ink discharge action is performed twice at most, in such a manner that four gradation steps are expressed by a large-sized dot, a medium-sized dot, a small-sized dot, and non-recording. In this embodiment, to express the four gradation steps, two drive signals which are the drive signal COM-A and the drive signal COM-B are provided and, further, both a preceding half pattern and a successive half pattern are provided in each drive signal for each period. During each period, either the drive signal COM-A or the drive signal COM-B (or neither signal) is selected in the preceding half period in accordance with the gradation to be expressed and, further, either (or neither) drive signal is selected in the successive half period. Then, the selected drive signal is supplied to the piezoelectric element 60.

Here, the drive signals COM-A and COM-B will be described and the description of the configuration for selecting the drive signal COM-A or the drive signal COM-B will be followed. Both the drive signals COM-A and the drive signal COM-B are generated by the driving circuits 50. For convenience of description, the configuration for selecting the drive signal COM-A or the drive signal COM-B will be described and the description of the driving circuit 50 will be followed.

Figure 5:
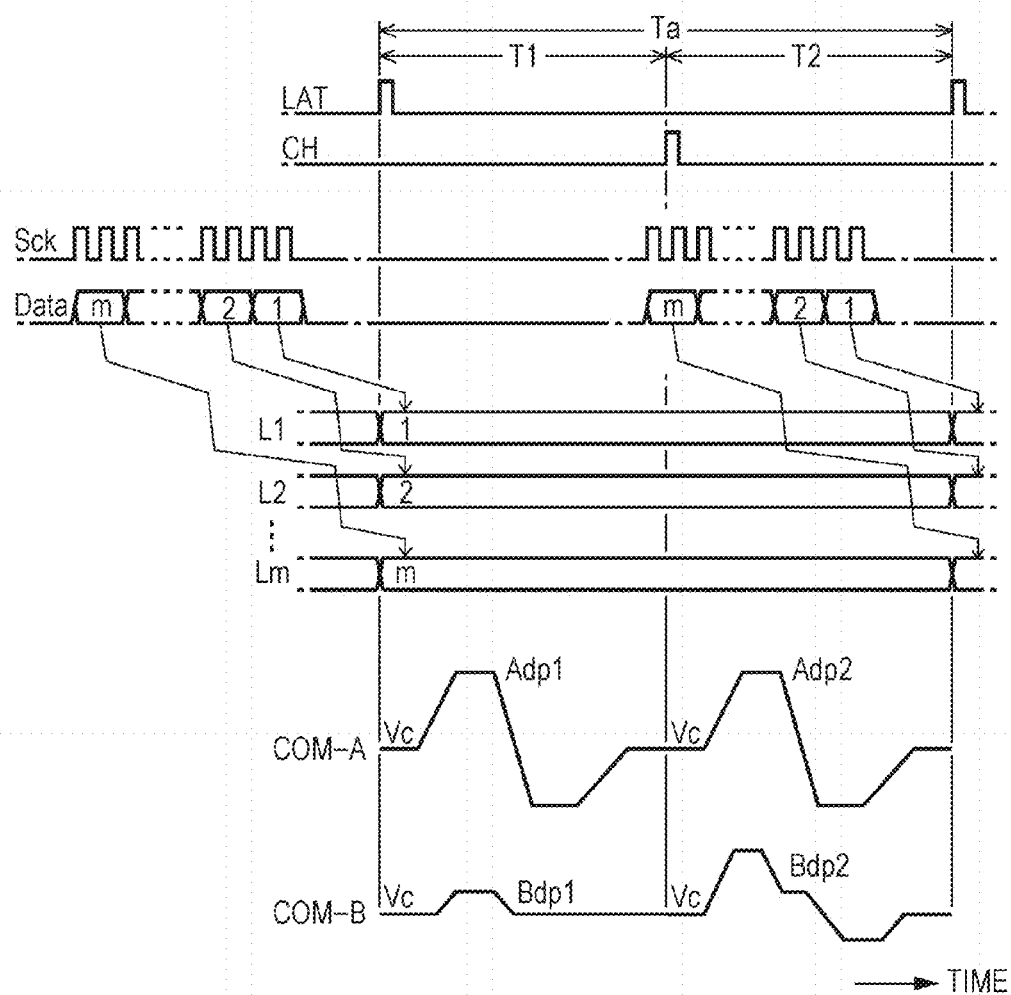
FIG. 5 is an explanatory view of an operation of a selection control portion in the head unit.

FIG. 5 is a view illustrating the waveforms of the drive signals COM-A and COM-B and the likes.

The drive signal COM-A has a waveform in which a trapezoidal waveform Adp1 and a trapezoidal waveform Adp2 are repeated, as illustrated in FIG. 5. In a printing period Ta, the trapezoidal waveform Adp1 is provided in a time period T1 which is a period from a time at which the control signal LAT is output (rises) to a time at which the control signal CH is output. Furthermore, in the printing period Ta, the trapezoidal waveform Adp2 is provided in a time period T2 which is a period from a time at which the control signal CH is output to a time at which a successive control signal LAT is output.

In this embodiment, the trapezoidal waveforms Adp1 and Adp2 have the substantially same shape. When the trapezoidal waveform Adp1 or Adp2 is supplied to one end of the piezoelectric element 60, a predetermined amount (specifically, a moderate amount) of ink is discharged from the nozzle 651 corresponding to the piezoelectric element 60.

The drive signal COM-B has a waveform in which a trapezoidal waveform Bdp1 and a trapezoidal waveform Bdp2 are repeated. The trapezoidal waveform Bdp1 is provided in the time period T1 and the trapezoidal waveform Bdp2 is provided in the time period T2. In this embodiment, the trapezoidal waveforms Bdp1 and Bdp2 have different shapes. The trapezoidal waveform Bdp1 is a waveform which is used for causing ink in the vicinity of the opening portion of the nozzle 651 to finely oscillate such that an increase in the viscosity of the ink is prevented. Accordingly, even when the trapezoidal waveform Bdp1 is supplied to one end of the piezoelectric element 60, an ink-droplet is not discharged from the nozzle 651 corresponding to the piezoelectric element 60. The trapezoidal waveform Bdp2 is a waveform having a shape different from that of the trapezoidal waveform Adp1 (or Adp2). When the trapezoidal waveform Bdp2 is supplied to one end of the piezoelectric element 60, an amount of ink, which is the amount smaller than the predetermined amount, is discharged from the nozzle 651 corresponding to the piezoelectric element 60.

In the trapezoidal waveform Adp1, Adp2, Bdp1, or Bdp2, the voltage at the start time and the voltage at the end time are the same voltage (which is a voltage Vc). In other words, the trapezoidal waveform Adp1, Adp2, Bdp1, or Bdp2 starts at the voltage Vc and finishes at the voltage Vc.

Figures 6, 7:
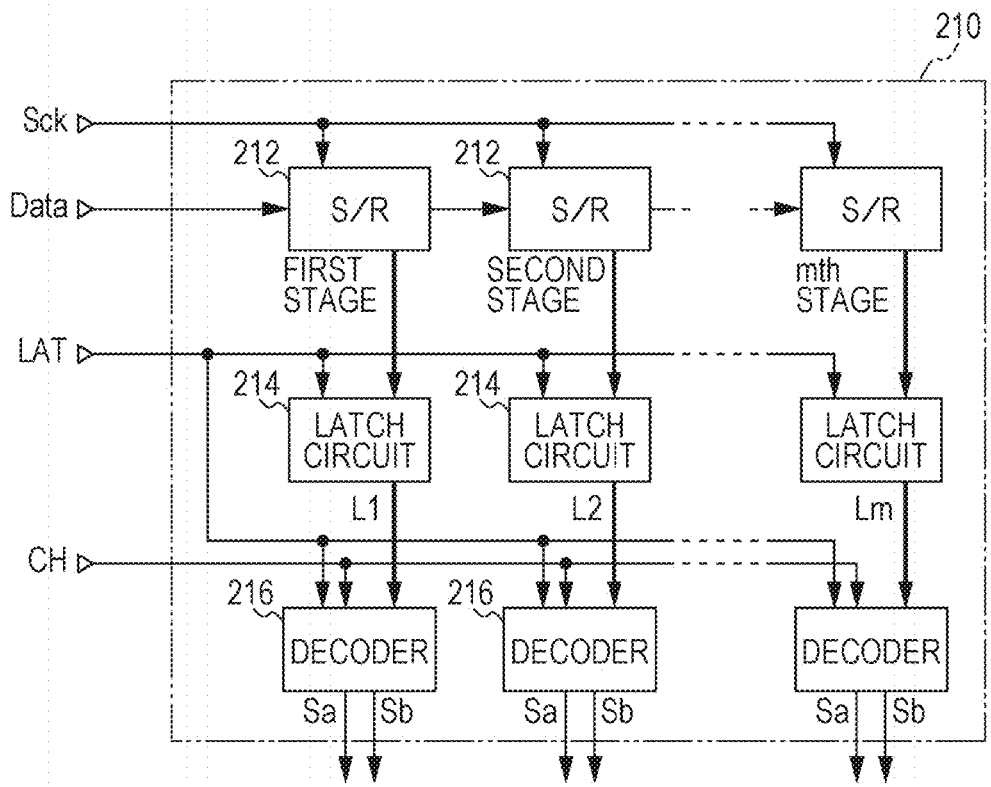
FIG. 6 is a view illustrating the configuration of the selection control portion in the head unit.
FIG. 7 is a view illustrating decoded contents of a decoder in the head unit.

FIG. 6 is a view illustrating the configuration of the selection control portion 210 in FIG. 2.

The clock signal Sck, the data signal Data, and the control signals LAT and CH are supplied from the control unit 10 to the selection control portion 210, as illustrated in FIG. 6. In the selection control portion 210, groups of shift registers (S/R) 212, latch circuits 214, and decoders 216 are provided in a state where the groups respectively correspond to the piezoelectric elements 60 (in other words, the nozzles 651).

When a dot of an image is formed, the data signal Data decides the size of the dot. In this embodiment, the data signal Data is two-bit data composed of a high-order bit (in other words, MSB) and a low-order bit (in other words, LSB) such that the four gradations are expressed by non-recording, a small-sized dot, a medium-sized dot, and a large-sized dot.

When the head unit 20 performs a main scanning operation, the data signal Data is synchronized with the clock signal Sck and is supplied, in series, from the control portion 100 to the respective nozzles. To correspond to each nozzle, the shift register 212 temporarily holds two bits of the data signal Data which is supplied in series.

Specifically, the shift registers 212 of which the number of stages corresponds to the number of piezoelectric elements 60 (in other words, nozzles) are cascade-connected to each other. The data signal Data supplied in series is transmitted, in order, to the shift registers 212 of successive stages, in accordance with the clock signal Sck.

To distinguish the shift registers 212 from one another, when the number of piezoelectric elements 60 is m (in this embodiment, m is a plural number), reference letters of a first stage, a second stage, etc. to an $m_{th}$ stage are given in order, from an upstream-side shift register 212 to a downstream-side shift register 212, in which the data signal Data is supplied in order, from the upstream-side shift register 212 to the downstream-side shift register 212.

When the control signal LAT rises, the latch circuit 214 latches the data signal Data which is held in the shift register 212.

The decoder 216 decodes two bits of the data signal Data, which is latched by the latch circuit 214. Next, the decoder 216 outputs select signals Sa and Sb for every time period T1 or T2 which is defined by both the control signal LAT and the control signal CH. Accordingly, selection by the selection portion 230 is decided.

FIG. 7 is a view illustrating the contents decoded by the decoder 216.

In FIG. 7, the two latched bits of the print data Data are expressed by (MSB, LSB). When the print data Data is, for example, (0, 1), this means that the decoder 216 causes the logic levels of the select signals Sa and Sb to be set as follows. In the time period T1, the logic level of the select signal Sa is set to H and that of the select signal Sb is set to L. Furthermore, in the time period T2, the logic level of the select signal Sa is set to L and that of the select signal Sb is set to H.

A level shifter (not illustrated) causes the logic levels of the select signals Sa and Sb to be shifted to the high-amplitude logic levels, compared to the logic level of the clock signal Sck, the print data Data, the control signal LAT, or the control signal CH.

Figure 8:
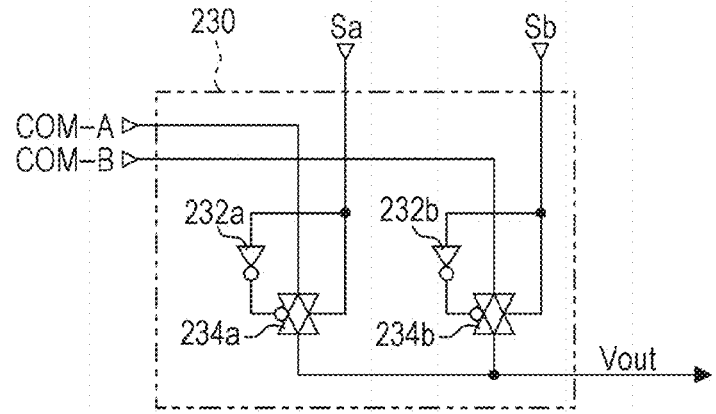
FIG. 8 is a view illustrating the configuration of a selection portion in the head unit.

FIG. 8 is a view illustrating the configuration of the selection portion 230 in FIG. 2, in which the selection portion 230 corresponds to one piezoelectric element 60 (in other words, one nozzle 651).

The selection portion 230 has inverters (NOT circuits) 232a and 232b and transfer gates 234a and 234b, as illustrated in FIG. 8.

The select signal Sa is supplied from the decoder 216 to a positive control terminal of the transfer gate 234a. In FIG. 8, the positive control terminal is on the side of the transfer gate 234a, to which a circular mark is not applied. Furthermore, the select signal Sa is subjected to logic inversion by the inverter 232a, and then the logic-inverted select signal Sa is supplied to a negative control terminal of the transfer gate 234a. In FIG. 8, the negative control terminal is on the side of the transfer gate 234a, to which a circular mark is applied. Similarly, the select signal Sb is supplied to a positive control terminal of the transfer gate 234b. Furthermore, the select signal Sb is subjected to logic inversion by the inverter 232b, and then the logic-inverted select signal Sb is supplied to a negative control terminal of the transfer gate 234b.

The drive signal COM-A is supplied to the input terminal of the transfer gate 234a and the drive signal COM-B is supplied to the input terminal of the transfer gate 234b. The output terminals of the transfer gates 234a and 234b are connected to each other and, further, are connected to one end of the piezoelectric element 60 corresponding to the transfer gates 234a and 234b.

When the logic level of the select signal Sa is H, the input terminal and the output terminal of the transfer gate 234a are conducted (set to an ON state). Furthermore, when the logic level of the select signal Sa is L, the input terminal and the output terminal are not conducted (set to an OFF state). Similarly to in the case of the transfer gate 234a, the input terminal and the output terminal of the transfer gate 234b are conducted or not conducted (set to the ON state or the OFF state), in accordance with the logic level of the select signal Sb.

Next, operations of both the selection control portion 210 and the selection portion 230 will be described with reference to FIG. 5.

The data signal Data is synchronized with the clock signal Sck and is supplied, in series, from the control portion 100 to the respective nozzles. The data signal Data is transmitted, in order, to the shift registers 212 corresponding to the respective nozzles. Then, when the control portion 100 stops supplying of the clock signal Sck, the data signal Data corresponding to each nozzle is held by each shift register 212. Items of data signal Data are supplied in an order in which the items of data signal Data respectively correspond to the nozzles corresponding to the last $m_{th}$-stage shift register 212, . . . , the second-stage shift register 212, and the first-stage shift register 212.

In this case, when the control signal LAT rises, the respective latch circuits 214 latch, at the same time, the data signal Data held by the shift registers 212. In FIG. 5, L1, L2 and so on to Lm express the data signal Data latched by the latch circuits 214 which respectively correspond to the first-stage shift register 212, the second-stage shift register 212 and so on to the $m_{th}$-stage shift register 212.

The decoder 216 outputs, in accordance with the size of dot defined by the latched data signal Data, the logic levels of the select signals Sa and Sb for every time period T1 or T2. The contents of the logic levels of the select signals Sa and Sb are as illustrated in FIG. 7.

In other words, first, when the data signal Data is (1, 1), and thus a large-sized dot is decided, the decoder 216 causes the logic levels of the select signals Sa and Sb to be set as follows. In the time period T1, the logic level of the select signal Sa is set to H and the logic level of the select signal Sb is set to L. Similarly, in the time period T2, the logic level of the select signal Sa is set to H and the logic level of the select signal Sb is set to L. Second, when the data signal Data is (0, 1), and thus a medium-sized dot is decided, the decoder 216 causes the logic levels of the select signals Sa and Sb to be set as follows. In the time period T1, the logic level of the select signal Sa is set to H and the logic level of the select signal Sb is set to L. Furthermore, in the time period T2, the logic level of the select signal Sa is set to L and the logic level of the select signal Sb is set to H. Third, when the data signal Data is (1, 0), and thus a small-sized dot is decided, the decoder 216 causes the logic levels of the select signals Sa and Sb to be set as follows. In the time period T1, the logic level of the select signal Sa is set to L and the logic level of the select signal Sb is set to L. Furthermore, in the time period T2, the logic level of the select signal Sa is set to L and the logic level of the select signal Sb is set to H. Fourth, when the data signal Data is (0, 0), and thus non-recording is decided, the decoder 216 causes the logic levels of the select signals Sa and Sb to be set as follows. In the time period T1, the logic level of the select signal Sa is set to H and the logic level of the select signal Sb is set to H. Furthermore, in the time period T2, the logic level of the select signal Sa is set to L and the logic level of the select signal Sb is set to L.

Figure 9:
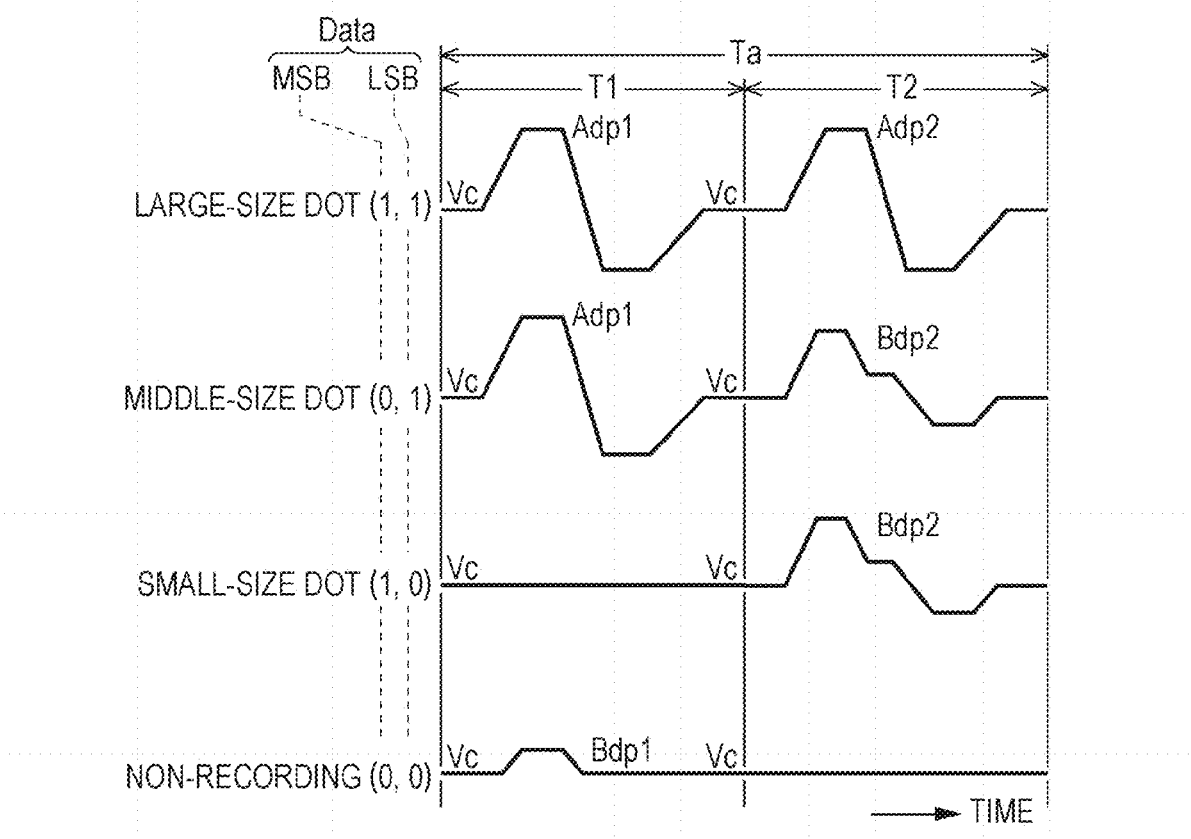
FIG. 9 is a view illustrating drive signals which are selected by the selection portion.

FIG. 9 is a view illustrating the voltage waveform of a drive signal which is selected in accordance with the data signal Data and is supplied to one end of the piezoelectric element 60.

When the data signal Data is (1, 1), the logic level of the select signal Sa is H during the time period T1 and the logic level of the select signal Sb is L. Accordingly, the transfer gate 234a is turned on and the transfer gate 234b is turned off. Thus, the trapezoidal waveform Adp1 of the drive signal COM-A is selected in the time period T1. Similarly, in the time period T2, the logic level of the select signal Sa is H and the logic level of the select signal Sb is L. Thus, in the time period T2, the selection portion 230 selects the trapezoidal waveform Adp2 of the drive signal COM-A.

As described above, the trapezoidal waveform Adp1 is selected in the time period T1 and the trapezoidal waveform Adp2 is selected in the time period T2. When the selected signals having the trapezoidal waveforms are supplied as a drive signal to one end of the piezoelectric element 60, two ink-discharge actions in which the amount of discharged ink is moderate are performed through the nozzle 651 corresponding to the piezoelectric element 60. Accordingly, two ink-droplets land on the printing medium P and are combined with each other. As a result, a large-sized dot is formed as defined by the data signal Data.

When the data signal Data is (0, 1), the logic level of the select signal Sa is H during the time period T1 and the logic level of the select signal Sb is L. Accordingly, the transfer gate 234a is turned on and the transfer gate 234b is turned off. Thus, the trapezoidal waveform Adp1 of the drive signal COM-A is selected in the time period T1. Furthermore, the logic level of the select signal Sa is L during the time period T2 and the logic level of the select signal Sb is H. Accordingly, the trapezoidal waveform Bdp2 of the drive signal COM-B is selected.

Thus, a moderate amount of ink and a small amount of ink are discharged in order, in such a manner that two ink-discharge actions are performed. Accordingly, two ink-droplets land on the printing medium P and are combined with each other. As a result, a medium-sized dot is formed as defined by the data signal Data.

When the data signal Data is (1, 0), the logic levels of both the select signals Sa and sb are L during the time period T1. Accordingly, both the transfer gates 234a and 234b are turned off. Thus, neither the trapezoidal waveform Adp1 nor the trapezoidal waveform Bdp1 is selected in the time period T1. When both the transfer gates 234a and 234b are turned off, a path which extends from the connection point between the output terminals of the transfer gates 234a and 234b to one end of the piezoelectric element 60 is in a high-impedance state in which the path is not electrically connected any portion. However, in this case, the piezoelectric element 60 holds the voltage ($Vc-V_{Bs}$) immediately before the transfer gate is turned off, because the piezoelectric element 60 itself is capacitive.

Subsequently, in the time period T2, the logic level of the select signal Sa is L and the logic level of select signal Sb is H. Accordingly, the trapezoidal waveform Bdp2 of the drive signal COM-B is selected. Thus, a small amount of ink is discharged through the nozzle 651, only in the time period T2. As a result, a small-sized dot is formed in the printing medium P, as defined by the data signal Data.

When the data signal Data is (0, 0), the logic level of the select signal Sa is L during the time period T1 and the logic level of the select signal Sb is H. Accordingly, the transfer gate 234a is turned off and the transfer gate 234b is turned on. Thus, the trapezoidal waveform Bdp1 of the drive signal COM-B is selected in the time period T1. Then, the logic levels of both the select signals Sa and Sb are L during the time period T2, and thus neither the trapezoidal waveform Adp2 nor the trapezoidal waveform Bdp2 is selected.

Therefore, in the time period T1, ink in the vicinity of the opening portion of the nozzle 651 is subjected to only fine-oscillation and ink is not discharged. As a result, a dot is not formed. In other words, non-recording is performed as defined by the data signal Data.

As described above, the selection portion 230 selects the drive signal COM-A or the drive signal COM-B (or selects neither drive signal), in accordance with the instruction from the selection control portion 210. Then, the selection portion 230 supplies the selected drive signal to one end of the piezoelectric element 60. As a result, the respective piezoelectric elements 60 are driven in accordance with the information relating to the size of dot, which is defined by the data signal Data.

The drive signals COM-A and COM-B illustrated in FIG. 5 are only an example of a drive signal. Combinations of various waveforms prepared in advance are used in accordance with a movement speed of the head unit 20, properties of the printing medium P or the like.

In this embodiment, a configuration in which the piezoelectric element 60 is bent upward in accordance with an increase in voltage is described. However, when voltages supplied to the two electrodes 611 and 612 are inverted, the piezoelectric element 60 is bent downward in accordance with a decrease in voltage. Accordingly, in the configuration in which the piezoelectric element 60 is bent downward in accordance with an increase in voltage, the waveforms of the drive signals COM-A and COM-B illustrated in the accompanying drawings have a shape inverted with respect to the voltage Vc as a reference.

In this embodiment, one dot is formed in the printing medium P, for each time period Ta as a unit time period, as described above. In this embodiment in which one dot is formed by performing (up to) two ink-droplet discharge actions during the time period Ta, the ink discharge frequency f is 2/Ta. Furthermore, the gap D between dots is a value obtained by dividing the movement velocity v of the head unit by the ink discharge frequency f (=2/Ta).

Generally, in a unit time period T, an ink-droplet can be discharged Q (in this embodiment, Q is an integer greater than 2) times. When an ink-droplet is discharged Q times, in such a manner that one dot is formed, the ink discharge frequency f satisfies the relationship of f=Q/T.

Upon comparison between a case where a different-sized dot is formed in the printing medium P, as in the case of this embodiment, and a case where one dot is formed by one ink-droplet discharge action, times (periods) necessary to form one dot are the same. However, the former case requires a reduction in time of one ink-droplet discharge action.

In a case of the third method in which the two or more ink-droplets are not combined, in such a manner that two or more dots are formed, it is not necessary to particularly describe the details thereof.

Next, the driving circuit 50 will be described. When schematically describing the two driving circuits 50, one generates the drive signal COM-A and the other generates the drive signal COM-B. In other words, first, one of the two driving circuits 50 analog-converts the data dA supplied from the control portion 100. Second, the driving circuit causes the drive signal COM-A to be fed back and the driving circuit 50 corrects, using high-frequency components of the drive signal COM-A, a difference between a signal (an attenuation signal) based on the drive signal COM-A and a target signal. Then, the driving circuit 50 generates a modulation signal, in accordance with the corrected signal. Third, the driving circuit 50 performs switching of a such a manner that the driving circuit 50 generates an amplified modulation signal. Fourth, the driving circuit 50 smoothens, by a low pass filter, the amplified modulation signal, and then the driving circuit 50 outputs, as the drive signal COM-A, the smoothened signal.

The other of the two driving circuits 50 has the same configuration as that of the one driving circuit 50, except that the drive signal COM-B is output based on the data dB. For convenience of description, the driving circuit 50 which outputs the drive signal COM-A will be described below.

Figure 10:
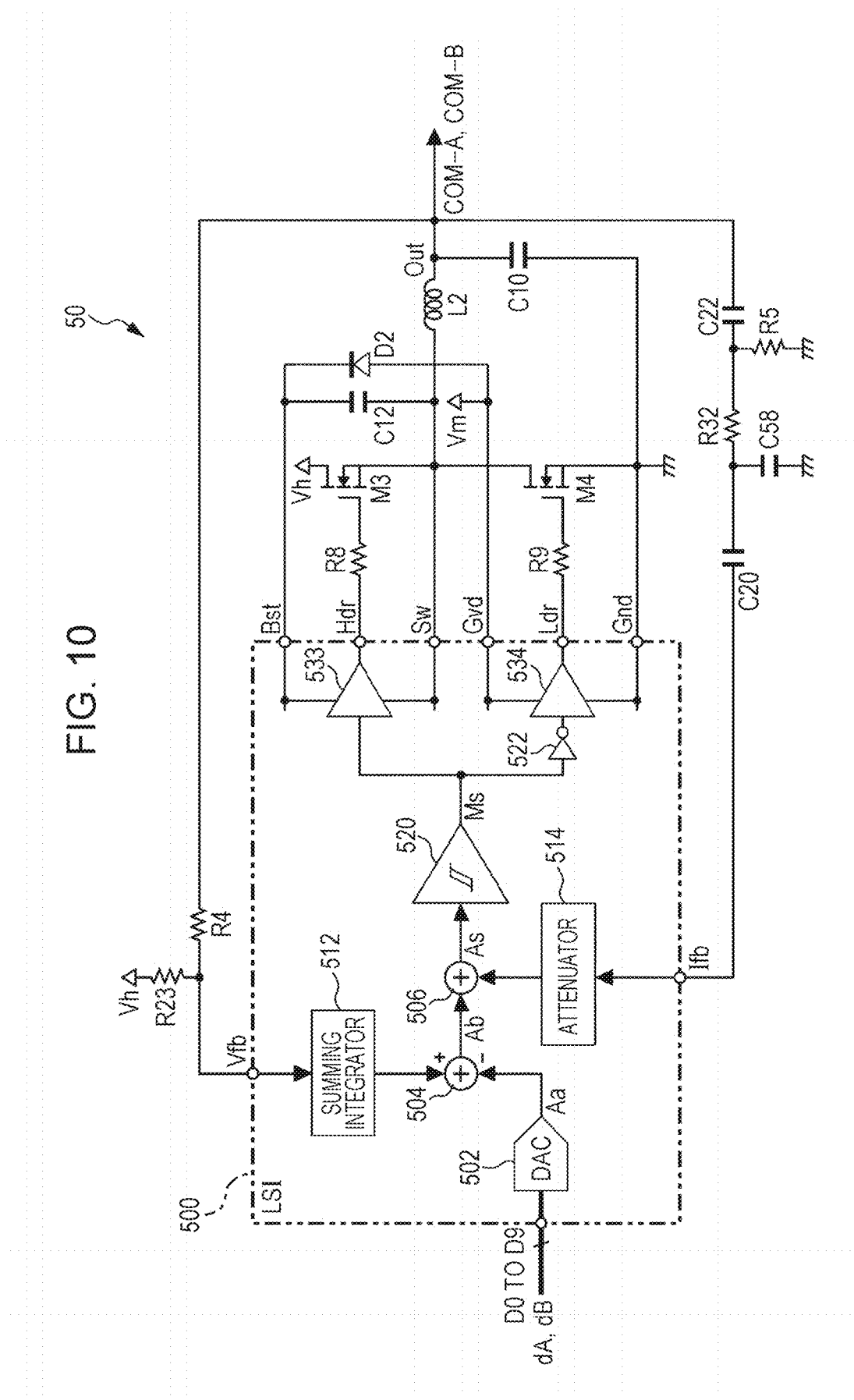
FIG. 10 is a view illustrating the configuration of a driving circuit in the printing apparatus.

FIG. 10 is a view illustrating the configuration of the driving circuit 50.

The driving circuit 50 is constituted of various elements, such as an LSI 500, transistors M3 and M4, a resistor, and a capacitor, as described in FIG. 10.

A configuration for outputting the drive signal COM-A is illustrated in FIG. 10. However, practically, circuits of two systems for generating both the drive signal COM-A and the drive signal COM-B are packaged in one LSI 500.

The Large Scale Integration (LSI) 500 outputs gate signals to the transistors M3 and M4, based on the data dA which is composed of 10 bits and is input from the control portion 100 through pins D0 to D9. Accordingly, the LSI 500 includes a Digital to Analog Converter (DAC) 502, adders 504 and 506, a summing integrator 512, an attenuator 514, a comparator 520, a NOT circuit 522, and gate drivers 533 and 534.

The DAC 502 converts, into an analog signal Aa, the data dA which decides the waveform of the drive signal COM-A. Then, the DAC 502 supplies the analog signal Aa to the (−) input terminal of the adder 504. The voltage amplitude of the analog signal Aa is set in the range of, for example, 0 volts to 2 volts. The voltage of the analog signal Aa is amplified by 20 times and a signal having the amplified voltage is used as the drive signal COM-A. In other words, the analog signal Aa is a target signal before the amplification of the drive signal COM-A is performed.

The summing integrator 512 attenuates and integrates a voltage, that is, the voltage of the drive signal COM-A, which is input from a terminal Out through a pin Vfb. Then, the summing integrator 512 supplies the attenuated and integrated voltage to the (+) input terminal of the adder 504.

The adder 504 supplies, to one input terminal of the adder 506, the signal Ab having a voltage which is obtained by subtracting the voltage of the (−) input terminal from the voltage of the (+) input terminal and integrating the remainder of the subtraction.

The power-supply voltage of a circuit extending from the DAC 502 to the NOT circuit 522 is 3.3 volts (which is a voltage Vdd) of low-amplitude. The maximum voltage of the analog signal Aa is about 2 volts. However, in some cases, the maximum voltage of the drive signal COM-A is greater than 40 volts. Accordingly, the summing integrator 512 attenuates the voltage of the drive signal COM-A such that, when a difference between the voltages of the two signals is calculated, the amplitude ranges of both voltages are matched to each other.

The attenuator 514 attenuates high-frequency components of the drive signal COM-A which is input through a pin Ifb. Then, the attenuator 514 supplies the attenuated signal to the other input terminal of the adder 506. The adder 506 supplies, to the comparator 520, a signal As having a voltage which is obtained by adding the voltage of the one input terminal and the voltage of the other input terminal. Similarly to in the case of the summing integrator 512, the attenuation by the attenuator 514 is performed to match the amplitude of a signal, during the feedback of the drive signal COM-A.

The voltage of the signal As which is output from the adder 506 is obtained by subtracting the voltage of the analog signal Aa from the attenuated voltage of the signal supplied through the pin Vfb and adding the remainder of the subtraction and the attenuated voltage of the signal supplied through the pin Ifb. Accordingly, it is possible to say that the signal As from the adder 506 is a signal of which the voltage is obtained as follows. A difference is calculated by subtracting the voltage of the analog signal Aa as a target signal from the attenuated voltage of the drive signal COM-A output from the terminal Out, and then the difference is corrected by the high-frequency components of the drive signal COM-A.

The comparator 520 outputs, based on the added voltage by the adder 506, a modulation signal Ms which is pulse-modulated as follows. Specifically, the comparator 520 outputs the modulation signal Ms of which the logic level is switched as follows. In a case where the voltage of the signal As output from the adder 506 increases, when the voltage of the As is equal to or greater than a voltage threshold Vth1, the logic level of the modulation signal Ms is switched to H. In contrast, in a case where the voltage of the signal As output from the adder 506 decreases, when the voltage of the As is equal to or less than a voltage threshold Vth2, the logic level of the modulation signal Ms is switched to L. The voltage thresholds satisfy the relationship of Vth1>Vth2, as described below.

The modulation signal Ms from the comparator 520 is subjected to logic-inversion by the NOT circuit 522, and then the logic-inverted modulation signal Ms is supplied to the gate driver 534. Meanwhile, the modulation signal Ms not subjected to logic-inversion is supplied to the gate driver 533.

Thus, the logic level of the signal supplied to the gate driver 533 has an exclusive relationship, with respect to the logic level of the signal supplied to the gate driver 534.

The logic levels of the signals supplied to the gate drivers 533 and 534 may be subjected to a timing control such that, practically, both the logic levels are prevented from becoming H at the same time (in other words, the transistors M3 and M4 are prevented from being turned on at the same time). Accordingly, the exclusive relationship mentioned above means that, in the strict sense, the logic levels are prevented from becoming H at the same time (in other words, the transistors M3 and M4 are prevented from being turned on at the same time).

Meanwhile, in a narrow sense, the modulation signal mentioned in this embodiment is the modulation signal Ms. However, when the modulation signal mentioned in this embodiment means a signal which is pulse-modulated in accordance with the analog signal Aa, an example of the modulation signal mentioned in this embodiment also includes a negative-logic inverted signal (which is a signal output from the NOT circuit 522) of the modulation signal Ms. In other words, examples of the modulation signal which is pulse-modulated in accordance with the analog signal Aa include not only the modulation signal Ms, but also a logic inverted signal of the modulation signal Ms and a signal subjected to a timing control.

The modulation signal Ms is output from the comparator 520. Thus, it is possible to say that a circuit extending to the comparator 520, which is the circuit constituted of the DAC 502, the adders 504 and 506, the summing integrator 512, the attenuator 514, and the comparator 520, is a modulation circuit for generating the modulation signal Ms.

In the configuration illustrated in FIG. 10, the DAC 502 converts the data dA of a digital type into the signal Aa of an analog type. However, without the intervention of the DAC 502, the signal Aa may be supplied from an external circuit, in accordance with the instruction from, for example, the control portion 100. Both the data dA of a digital type and the signal Aa of an analog type function as a source signal because, when the waveform of the drive signal COM-A is generated, either decides a target value.

The gate driver 534 level-shifts a low-amplitude logic signal (L level: 0 volts, H level: 3.3 volts) which is a signal output from the comparator 520, to a high-amplitude logic signal (for example, L level: 0 volts, H level, 7.5 volts). Then, the gate driver 534 outputs the level-shifted signal, through a pin Ldr. A voltage Vm (which is, for example, 12 volts) is applied to a pin Gvd, as a high-potential side voltage of the power-supply voltage of the gate driver 534 and zero voltage is applied to a pin Gnd, as a low-potential side voltage thereof. In other words, the pin Gvd is earthed to the ground. The pin Gvd is connected to a cathode electrode of a diode D2 for preventing backflow and an anode electrode of the diode D2 is connected to both one end of a capacitor C12 and a pin Bst.

The gate driver 533 level-shifts a low-amplitude logic signal which is a signal output from the NOT circuit 522, to a high-amplitude logic signal. Then, the gate driver 533 outputs the level-shifted signal, through a pin Hdr. In the power-supply voltage of the gate driver 533, a high-potential side voltage is the voltage applied through the pin Bst and a low-potential side voltage is the voltage applied through a pin Sw. The pin Sw is connected to a source electrode of the transistor M3, a drain electrode of the transistor M4, the other end of a capacitor C12, and one end of an inductor L2.

The transistors M3 and M4 are constituted of, for example, Field Effect Transistors (FET) of an N-channel type. In the transistor M3 which is a high-side transistor, a voltage Vh (which is, for example, 42 volts) is applied to a drain electrode and a gate electrode is connected, via a resistor R8, to the pin Hdr. In the transistor M4 which is a low-side transistor, a gate electrode is connected, via a resistor R9, to the pin Ldr and a source electrode is earthed to the ground.

The other end of the inductor L2 is the terminal Out which is the output terminal of the driving circuit 50. The drive signal COM-A is supplied from the terminal Out to the head unit 20, through the flexible cable 190 (see FIGS. 1 and 2).

The terminal Out is connected to one end of a capacitor C10, one end of a capacitor C22, and one end of a resistor R4. The other end of the capacitor C10 is earthed to the ground. As a result, a group of the inductor L2 and the capacitor C10 functions as a Low Pass Filter (LPF) which smoothens an amplified modulation signal which is generated in the connection point between the transistor M3 and transistor M4.

The other end of the resistor R4 is connected to the pin Vfb and one end of a resistor R23. The voltage Vh is applied to the other end of the resistor R23. Accordingly, the drive signal COM-A from the terminal Out is pulled up and fed back to the pin Vfb.

Meanwhile, the other end of the capacitor C22 is connected to one end of a resistor R5 and one end of a resistor R32. The other end of the resistor R5 is earthed to the ground. As a result, a group of the capacitor C22 and the resistor R5 functions as a High Pass Filter (HPF) which passes high-frequency components of the drive signal COM-A from the terminal Out, in which the frequency of the high-frequency components is equal to or higher than a cut-off frequency. The cut-off frequency of the HPF is set to, for example, about 9 MHz.

The other end of the resistor R32 is connected to one end of a capacitor C20 and one end of a capacitor C58. The other end of the capacitor C58 is earthed to the ground. As a result, a group of the resistor R32 and the capacitor C58 functions as a Low Pass Filter (LPF) which passes low-frequency components of the signal components passed through the HPF described above, in which the frequency of the low-frequency components is equal to or lower than a cut-off frequency. The cut-off frequency of the LPF is set to, for example, about 160 MHz.

The cut-off frequency of the HPF is se to be lower than the cut-off frequency of the LPF. Thus, the HPF and the LPF function as a BPF (Band Pass Filter) which allows high-frequency components of the drive signal COM-A, which is within a predetermined frequency range, to pass therethrough.

The other end of the capacitor C20 is connected to the pin Ifb of the LSI 500. The high-frequency components of the drive signal COM-A passed through the BPF is fed back to the pin Ifb, in a state where direct-current components of the high-frequency components are cut off.

Meanwhile, the drive signal COM-A output from the terminal Out is a signal which is obtained by smoothening, using the low pass filter constituted of the inductor L2 and the capacitor C10, the amplified modulation signal generated in the connection point (in other words, the pin Sw) between the transistor M3 and the transistor M4. The drive signal COM-A is positive-fed back to the adder 504 through the pin Vfb, in a state where the drive signal COM-A is subjected to integration and subtraction. Thus, the drive signal COM-A is subjected to self-excited oscillation at a frequency which is decided according to both a delay (which is the sum of a delay resulting from smoothening by both the inductor L2 and the capacitor C10 and a delay by the summing integrator 512) of feedback and a feedback transfer function.

However, the amount of delay in a feedback path passing through the pin Vfb is great. Thus, when only the feedback through the pin Vfb is provided in the driving circuit 50, it is not possible to provide an adequately high self-excited oscillation frequency at which a sufficient accuracy of the drive signal COM-A can be ensured.

Accordingly, in addition to the feedback path passing through the pin Vfb, a feedback path passing through the pin Ifb, through which the high-frequency components of the drive signal COM-A are fed back, is provided in this embodiment. Thus, the delay is reduced in terms of the entirety of the circuit. As a result, upon comparison with the case where the feedback path passing through the pin Ifb is not provided, the frequency of the signal As which is obtained by adding the high-frequency components of the drive signal COM-A to the signal Ab becomes a high frequency at which a sufficient accuracy of the drive signal COM-A can be ensured.

Figure 11:
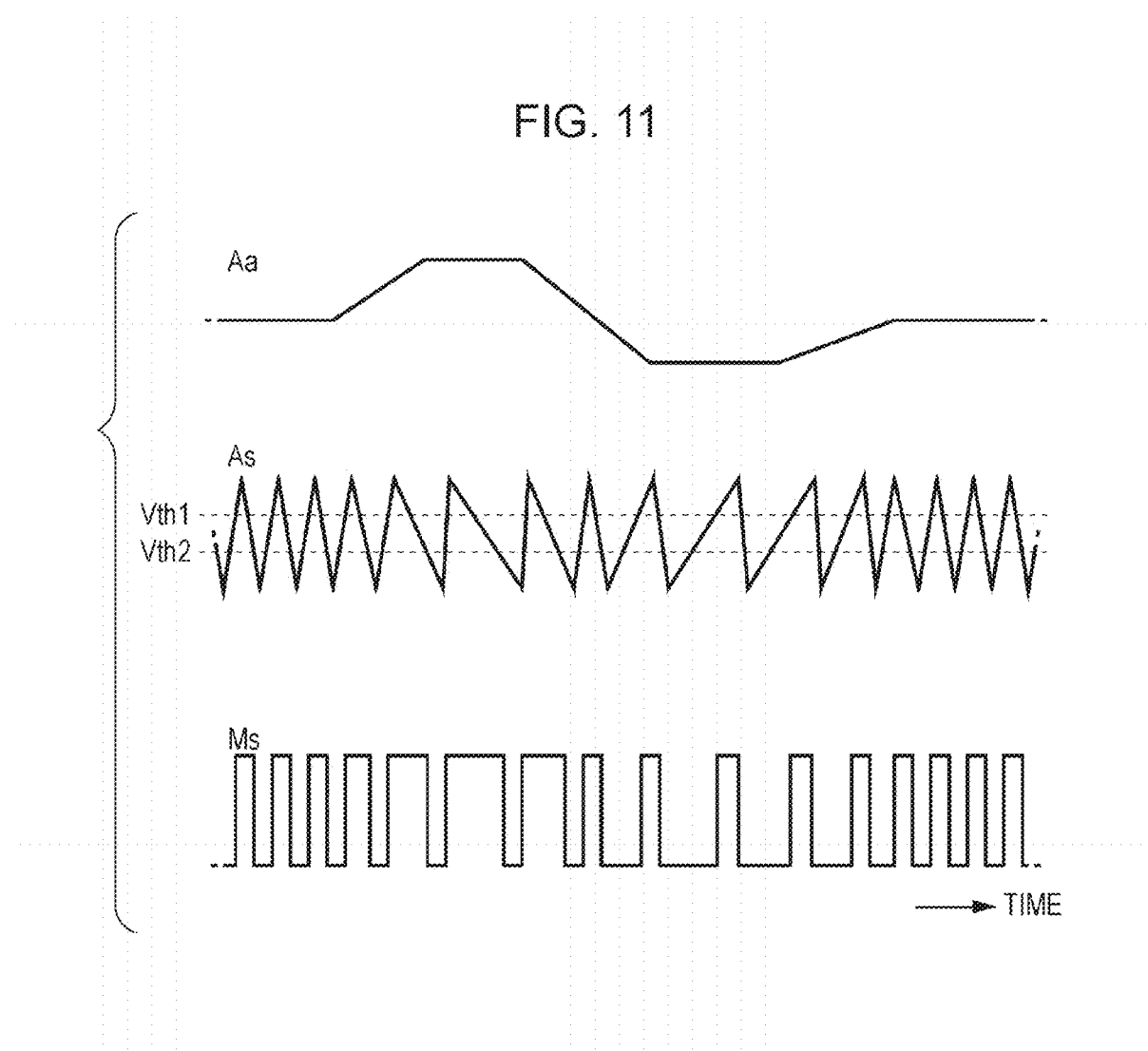
FIG. 11 is an explanatory view of the operation of the driving circuit.

FIG. 11 is a view in which both the waveform of the signal As and the waveform of the modulation signal Ms are illustrated in association with the waveform of the signal Aa.

The waveform of the signal As has a triangular shape, as illustrated in FIG. 11. The oscillation frequency of the signal As changes in accordance with the voltage (which is the input voltage) of the signal Aa. Specifically, when the value of the input voltage is a median, the oscillation frequency of the signal As becomes the highest. When the value of the input voltage increases or decreases from the median, the oscillation frequency of the signal As decreases.

In the triangular waveform of the signal As, inclination degrees of both the ascending slope (in which the voltage increases) and the descending slope (in which the voltage decreases) are substantially the same when the value of the input voltage is about the median. Thus, the duty ratio of the modulation signal Ms is approximately 50%, in which the duty ratio of the modulation signal Ms is the result of the comparison between the signal As and the voltage thresholds Vth1 and Vth2, using the comparator 520. The inclination of the descending slope of the waveform of the signal As becomes gentler, as the input voltage increases from the median. As a result, the time period in which the logic level of the modulation signal Ms is H becomes longer, and thus the duty ratio increases. In contrast, the inclination of the ascending slope of the waveform of the signal As becomes gentler, as the input voltage decreases from the median. As a result, the time period in which the logic level of the modulation signal Ms is L becomes shorter, and thus the duty ratio decreases.

Thus, it is possible to say that the modulation signal Ms is a pulse-density modulation signal having the following characteristics. That is, when the value of the input voltage is the median, the duty ratio of the modulation signal Ms is approximately 50%. When the input voltage increases over the median, the duty ratio of the modulation signal Ms increases. When the input voltage decreases below the median, the duty ratio thereof decreases.

The gate driver 533 turns on/off the transistor M3, in accordance with the modulation signal Ms. In other words, when the logic level of the modulation signal Ms is H, the gate driver 533 turns on the transistor M3. In contrast, when the logic level of the modulation signal Ms is L, the gate driver 533 turns off the medium transistor M3. The gate driver 534 turns on/off the transistor M4, in accordance with the logic inversion signal of the modulation signal Ms. In other words, when the logic level of the modulation signal Ms is H, the gate driver 534 turns off the transistor M4. In contrast, when the logic level of the modulation signal Ms is L, the gate driver 534 turns on the medium transistor M4.

Thus, in the drive signal COM-A which is obtained by smoothening the amplified modulation signal generated in the connection point between the transistors M3 and M4, using both the inductor L2 and the capacitor C10, the voltage of the drive signal COM-A increases in accordance with an increase in the duty ratio of the modulation signal Ms and the voltage of the drive signal COM-A decreases in accordance with a decrease in the duty ratio of the modulation signal Ms. As a result, the drive signal COM-A is controlled and output such that the voltage of the drive signal COM-A follows, in an enlarged manner, the voltage of the signal Aa.

A pulse-density modulation is performed in the driving circuit 50. Thus, upon comparison with a circuit in which pulse-width modulation is performed with a fixed modulation frequency, the driving circuit 50 has an advantage in that a large variation width of the duty ratio can be ensured.

In other words, in terms of the entirety of a circuit, the minimum positive-pulse width and the minimum negative-pulse width are regulated by characteristics of the circuit. Thus, when a pulse-width modulation is performed with a fixed frequency, only a predetermined range (which is a range of, for example, 10% to 90%) of the variation width can be ensured in a duty ratio. However, when a pulse density modulation is performed, the oscillation frequency gradually decreases, as the value of the input voltage moves away from the median. Thus, a relatively large duty-ratio can be ensured in a high input-voltage range and a relatively small duty-ratio can be ensured in a low input-voltage range. As a result, when a self-excited oscillation type pulse-density modulation is performed, a relatively wide range (which is a range of, for example, 5% to 95%) of the variation width can be ensured in a duty ratio.

Furthermore, the driving circuit 50 is a self-excited oscillation type circuit. Accordingly, the driving circuit 50 does not require a circuit for generating a carrier wave having a high frequency, unlike a separately-excited oscillation type circuit. As a result, the driving circuit 50 has an advantage in that it is easy to integrate the component, in other words, the LSI 500, other than a circuit dealing with high voltage.

Furthermore, not only the feedback circuit passing through the pin Vfb but also the feedback path passing through the pin Ifb, through which the high-frequency components are fed back, are provided in the driving circuit 50, as a feedback path of the drive signal COM-A. Accordingly, the delay is reduced, in terms of the entirety of the circuit. As a result, the high self-excited oscillation frequency is ensured, and thus the driving circuit 50 can generate the drive signal COM-A with high accuracy.

Various elements, such as a capacitor and resistor, are mounted on a multilayer substrate, in such a manner that the driving circuit 50 described above is formed. Next, the mounting state of the various elements on a print circuit substrate will be described. In addition, routing of wiring in the print circuit substrate will be described.

The print circuit substrate is a four-layer substrate. The print circuit substrate has a configuration in which wiring patterns of a first layer, a second layer, a third layer, and a fourth layer are stacked with insulation layers interposed therebetween, as described below. Furthermore, the wiring patterns of different layers are appropriately electrically connected through a through-hole. In this configuration, the layer means not an insulation layer but a wiring-pattern forming layer which is provided in a portion between adjacent insulation layers.

Figure 12:
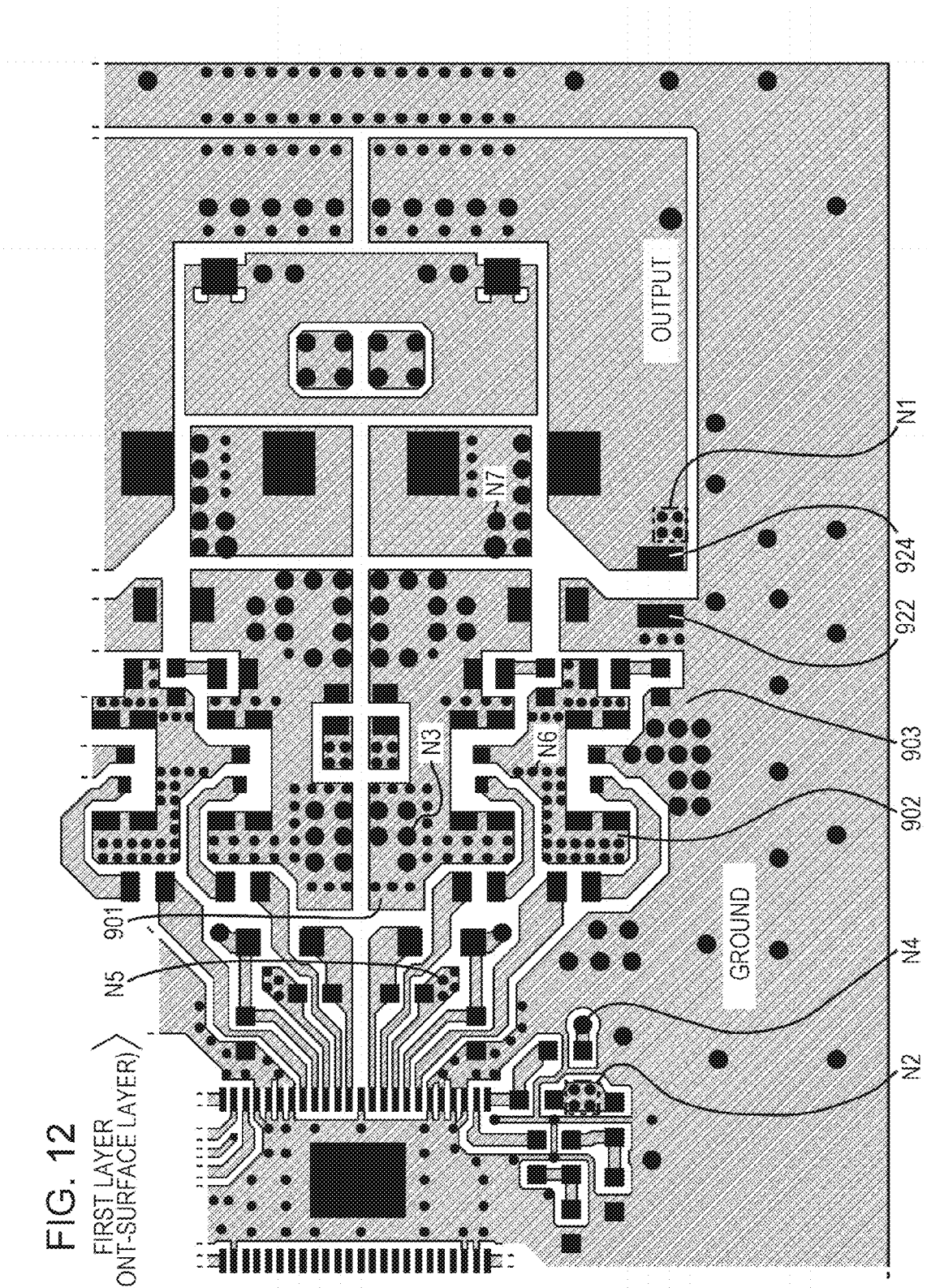
FIG. 12 illustrates a wiring pattern of a first layer of a print circuit substrate.
Figure 13:
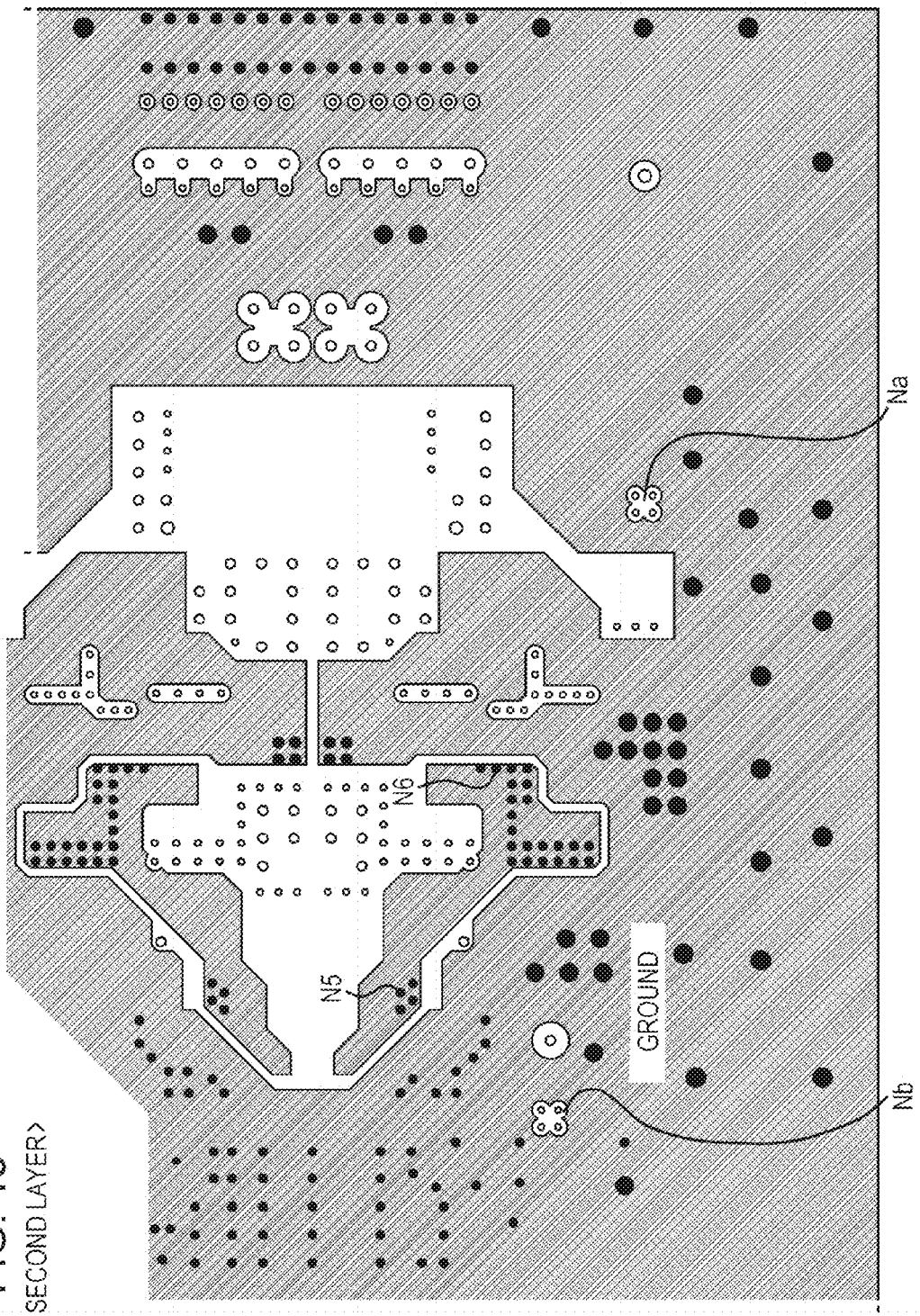
FIG. 13 illustrates a wiring pattern of a second layer of the print circuit substrate.
Figure 14:
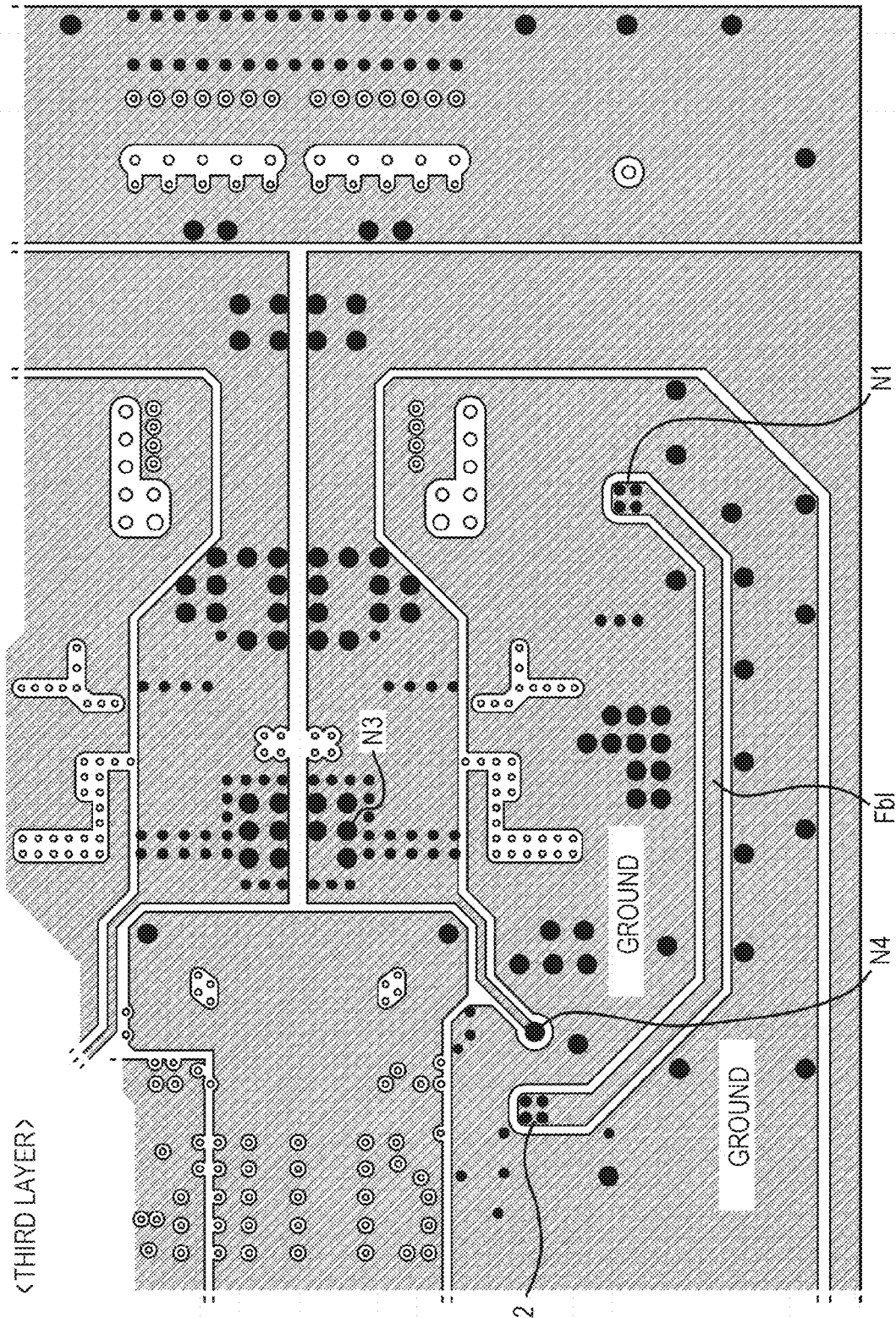
FIG. 14 illustrates a wiring pattern of a third layer of the print circuit substrate.
Figure 15:
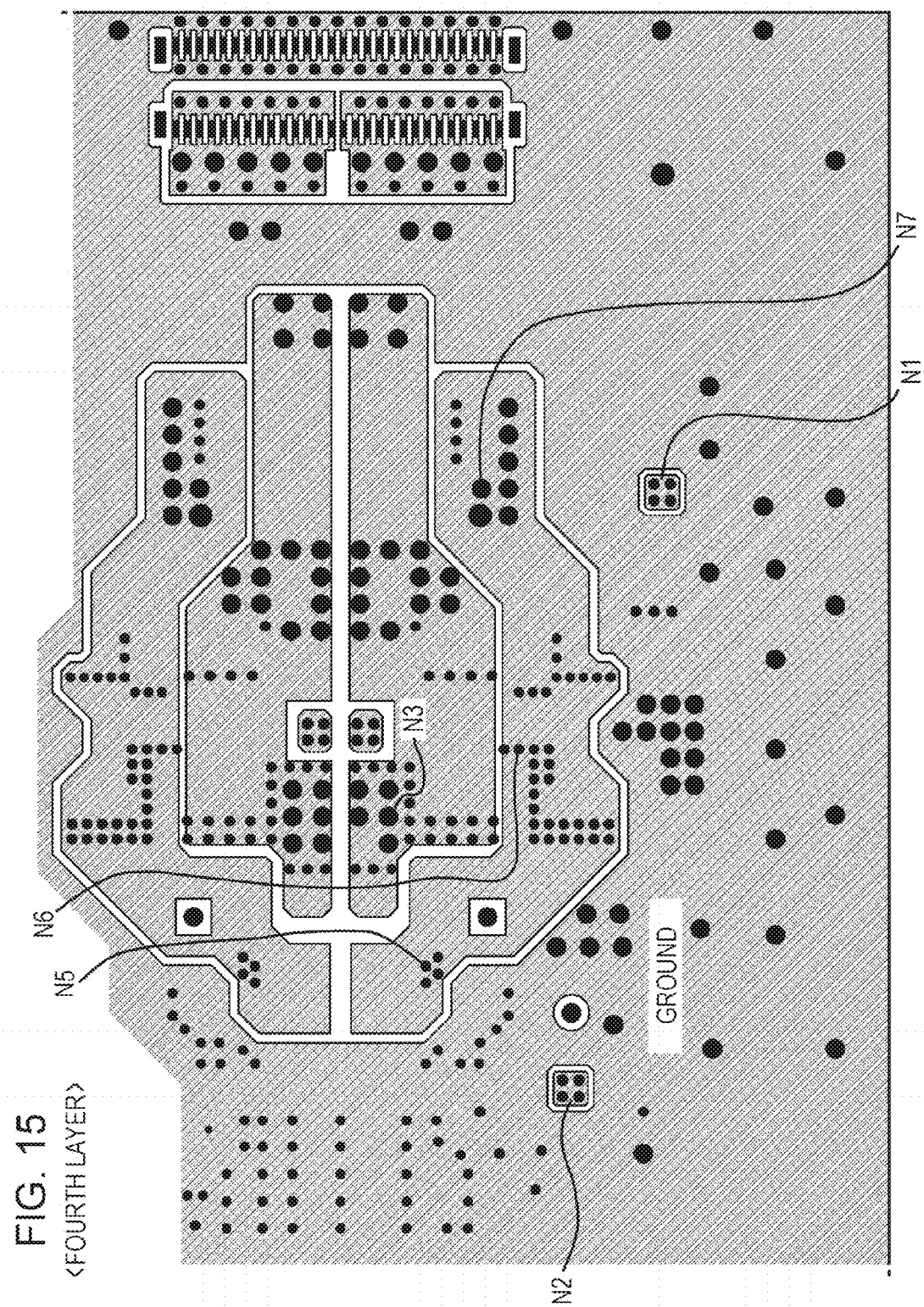
FIG. 15 illustrates a wiring pattern of a fourth layer of the print circuit substrate.

FIG. 12 is a view illustrating a part of the wiring pattern of the first layer of the print circuit substrate, which is a portion in the vicinity of an area constituting the driving circuit 50. Similarly, FIGS. 13 to 15 are views which respectively illustrate the wiring patterns of the second layer, the third layer, and the fourth layer of the print circuit substrate.

In FIGS. 12 to 15, the first layer, the second layer, the third layer, and the fourth layer are given to the four layers constituting the print circuit substrate, in order from a mounting surface side. Thus, the first layer and the fourth layer are front-surface layers and the second layer and the third layer are layers other than the front-surface layer. FIGS. 12 to 15 illustrate plan views of the print circuit substrate, when seen from the mounting surface side.

In FIGS. 12 to 15, the areas illustrated by hatching are the wiring patterns subjected to patterning using copper foil. In a wiring pattern of one layer, a black circular portion is a through-hole (that is, a via hole) through which the wiring pattern of the one layer is connected to a wiring pattern of the other layer. In each layer, the area illustrated without using hatching is an area in which a wiring pattern is not provided. In the area illustrated without hatching, a white circular portion is an opening portion of a through-hole which connects wiring patterns of the other layers while preventing the wiring pattern of the one layer from being connected to the wiring patterns of the other layers.

In the wiring pattern of the first layer illustrated in FIG. 12, black rectangular portions are lands (which are not terminals but connection portions in the print circuit substrate) used for connecting various elements. The wiring patterns of the first layer and the fourth layer which are the front-surface layers are protected by a solder resist (not illustrated), except for the through-hole and the land. In other words, it is possible to say that, in the print circuit substrate, the land and the through-hole are exposed portions of the wiring pattern.

Figure 16:
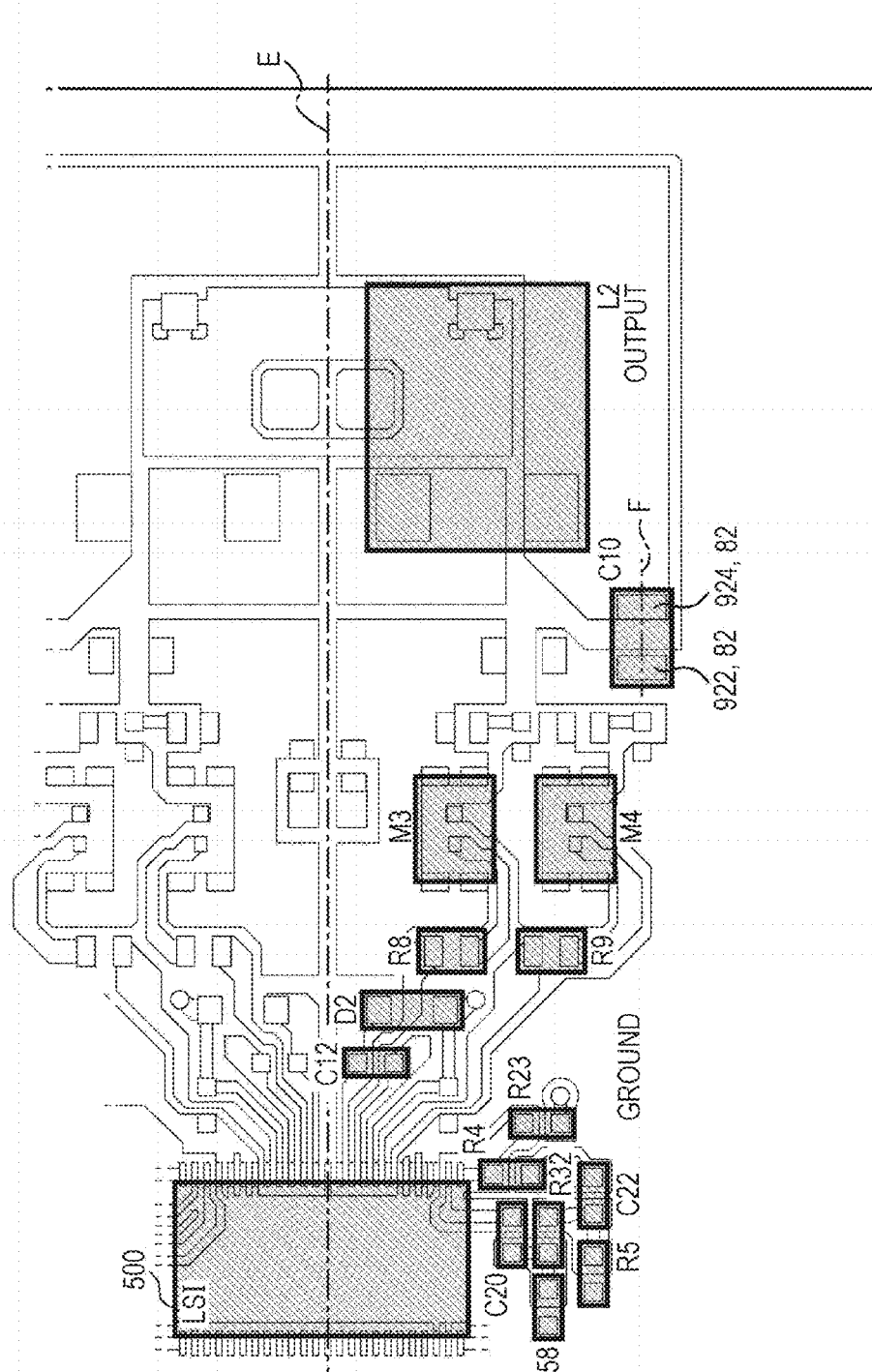
FIG. 16 is a view illustrating the arrangement of elements in the print circuit substrate.
Figure 17:
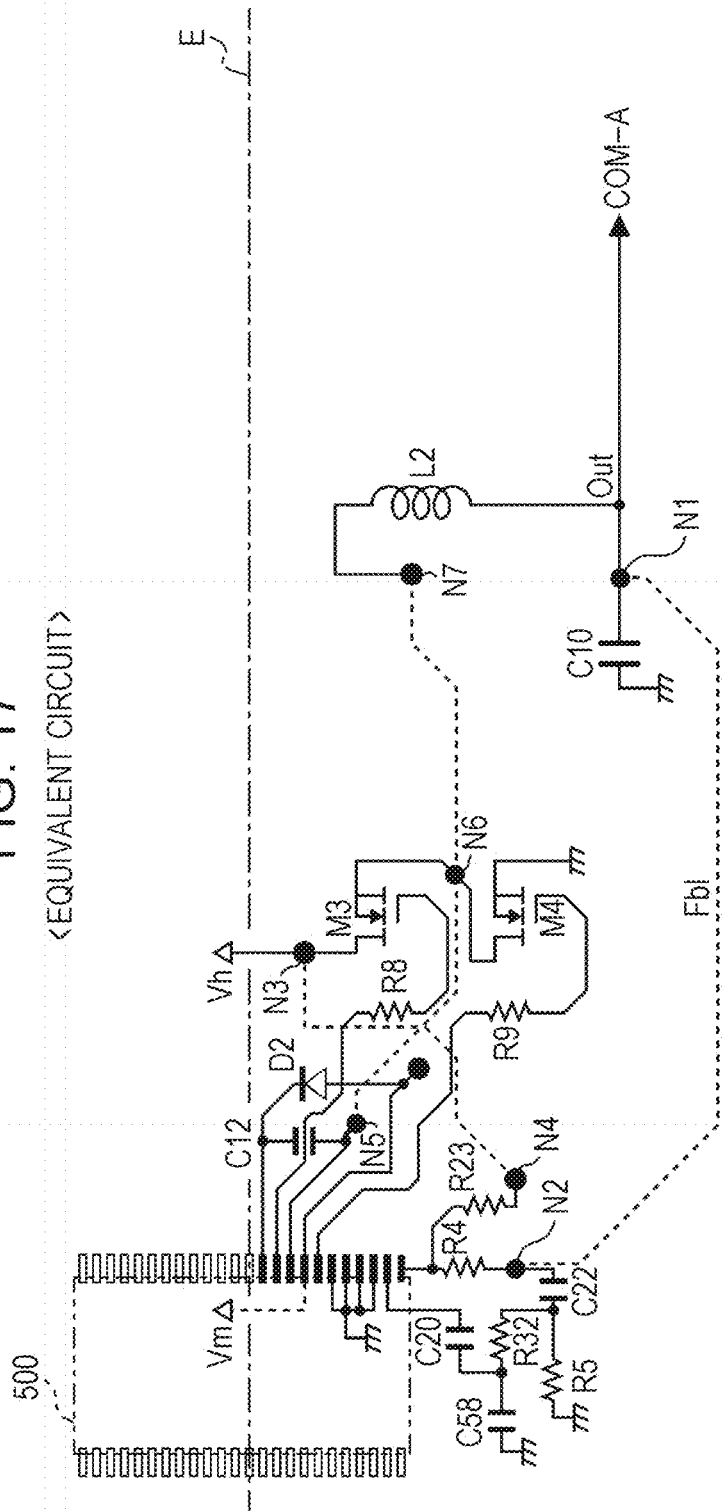
FIG. 17 is a view illustrating the equivalent circuit of the driving circuit in the print circuit substrate.
Figure 18:
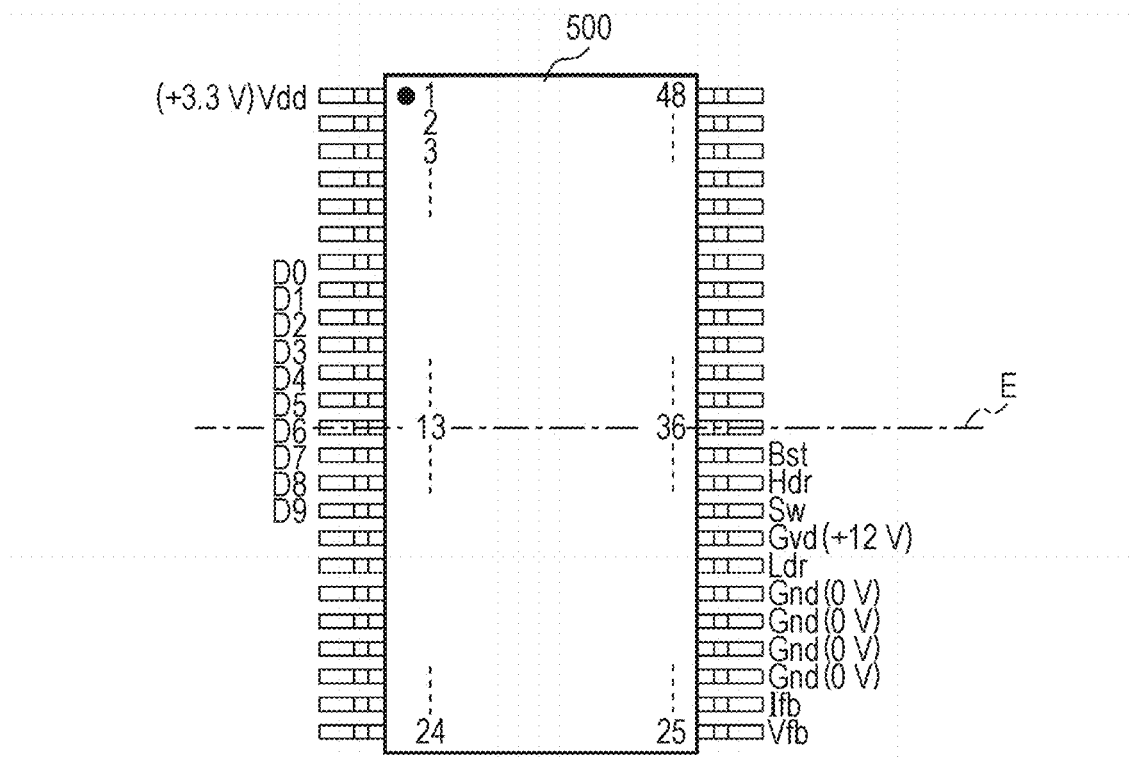
FIG. 18 is a view illustrating the pin assignment of an LSI in the driving circuit.

FIG. 16 is a plan view illustrating the arrangement of the elements constituting the driving circuit 50, in the print circuit substrate. FIG. 17 is a view illustrating the equivalent circuit of the driving circuit 50, in association with the arrangement of the elements mounted on the print circuit substrate. FIG. 18 is a view illustrating the pin assignment of the LSI 500, in which the pins are arranged in a dual-in-line package.

To show the planar configuration of the print circuit substrate, FIGS. 12 to 17 have the same scale. However, for convenience of description, the scale of FIG. 18 is larger than the scale of FIGS. 12 to 17. Pin numbers of the LSI 500 are given as follows. "1" is given to a pin indicated by a black circular mark on the upper left side of the LSI 500 in FIG. 18. "2", "3", "4" and so on to "48" are given in counterclockwise order, in which the pin having the pin number "1" is used as a reference pin.

In wiring of the equivalent circuit illustrated in FIG. 17, a solid line illustrates wiring constituted by the wiring pattern of the first layer (see FIG. 12) and the broken line illustrates wirings constituted by the wiring patterns of the second layer, the third layer, and the fourth layer.

The terminal Out which is the connection portion between the other end of the inductor L2 and one end of the capacitor C10 is connected, through the through-hole N1, to one end of a feedback wiring pattern Fbl (see FIG. 14).

Figure 19:
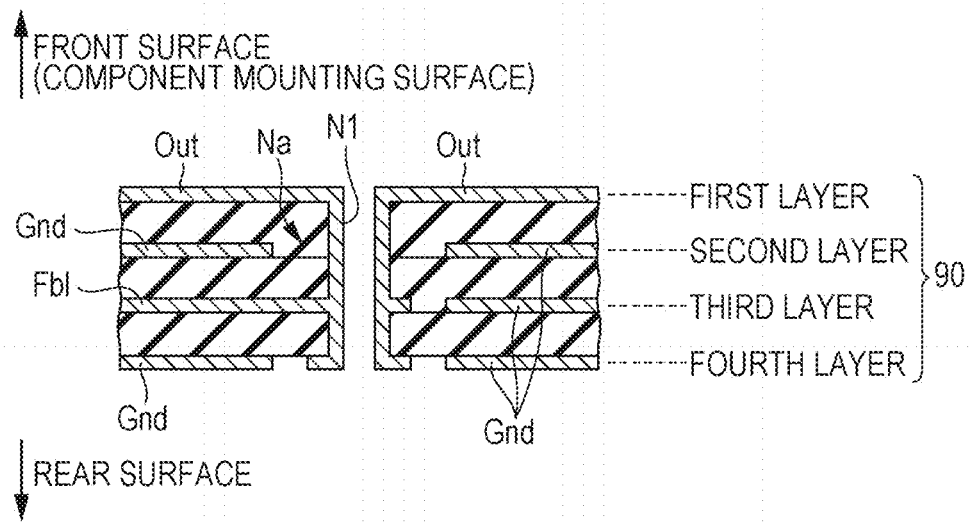
FIG. 19 is a cross-sectional view illustrating the configuration of a through-hole in the print circuit substrate.

FIG. 19 is a partial cross-sectional view illustrating the configuration of a part of the print circuit substrate, which is a portion in the vicinity of a through-hole N1.

A print circuit substrate 90 has a configuration in which the wiring patterns of the first layer, the second layer, the third layer, and the fourth layer and insulating resins, such as glass epoxy, are stacked on one another. The wiring pattern of the first layer, which includes the terminal Out, is connected, through the through-hole N1, to one end of the feedback wiring pattern Fbl of the wiring pattern of the third layer.

A wiring pattern which is connected to the terminal Out (or the feedback wiring pattern Fbl) through the through-hole N1 is not provided in the second layer. Accordingly, a ground portion of the wiring pattern of the second layer has a pattern shape in which the ground portion is not in contact with the passing-through portion of the through-hole N1 (see FIG. 13).

The other end of the feedback wiring pattern Fbl is connected, through a through-hole N2, to both one end of the resistor R4 and one end of the capacitor C12 which are provided in the wiring pattern of the first layer (see FIG. 17). The cross-sectional configuration of the through-hole N2 is substantially the same as that of the through-hole N1. Accordingly, cross-sectional configuration of the through-hole N2 is not illustrated in the accompanying drawings. The ground portion of the wiring pattern of the second layer has a pattern shape in which, in an area Nb, the ground portion is not in contact with the opening portion of the through-hole N2, as illustrated in FIG. 13.

In the driving circuit 50, both the path extending from the terminal Out to the pin Vfb and the path extending from the terminal Out to the pin Ifb are provided as a feedback path. In the feedback path, the feedback wiring pattern Fbl are used in both paths described above. The feedback wiring pattern Fbl is formed in the third layer and extends from the through-hole N1 to the through-hole N2.

Practically, each through-hole (for example, the through-hole N1 or N2) is constituted of not a single through-hole part but a plurality of through-hole parts, as can be understood from FIG. 12 and the likes. In the case of the through-holes N1 and N2, each through-hole N1 or N2 is constituted of four through-hole parts. However, in a functional point of view, it is not necessary to distinguish whether each through-hole is constituted of a single through-hole part or a plurality of through-hole parts. Thus, in the following description, whether each through-hole is constituted of a single through-hole part or a plurality of through-hole parts is not distinguished.

The feedback wiring pattern Fbl of the third layer is surrounded by a ground wiring pattern, as illustrated in FIG. 14. When the feedback wiring pattern Fbl of the third layer is viewed from the top, both a part of the wiring pattern of the second layer (see FIG. 13) and a part of the wiring pattern of the fourth layer (see FIG. 15), which are portions overlapping the feedback wiring pattern Fbl, are formed of ground wiring patterns.

In the third layer, the feedback wiring pattern Fbl is surrounded, in a plane direction of the substrate, by the ground wiring pattern of the third layer. Furthermore, in a vertical direction of the substrate, the feedback wiring pattern Fbl is surrounded by ground wiring patterns of both the second layer and the fourth layer.

In the circuit diagram of FIG. 10, the path extending from the terminal Out is divided into two paths which are the feedback path extending to the pin Vfb of LSI 500 and the feedback path extending to the pin Ifb. However, practically, the path from the terminal Out extends as follows, as illustrated in FIG. 17. The path from the terminal Out of the first layer extends to the feedback wiring pattern Fbl, through the through-hole N1. Further, in a portion immediately ahead of the LSI 500, the path passing through the feedback wiring pattern Fbl extends to return to the first layer, through the through-hole N2. Then, the path is divided into two paths, in which one path extends to the one end of the resistor R4 and the other extends to the one end of the capacitor C22. In the two paths, the path extending to the resistor R4 side is the feedback path directed to the pin Vfb and the path extending to the capacitor C22 side is the feedback path directed to the pin Ifb.

In the first layer, an area of the feedback path directed to the pin Vfb, in which the resistor R4 is disposed, is surrounded by the ground pattern. Furthermore, a ground pattern is provided in a portion between one terminal and the other terminal of the resistor R4. Similarly, in the case of the resistor R23 which pulls up the pin Vfb, the installation area of the resistor R23 is surrounded by a ground pattern and a ground pattern is provided in a portion between terminals of the resistor R23.

In addition to the capacitor C22, the resistor R32 and the capacitor C20 are provided in the feedback path directed to the pin Ifb. Similarly to in the case described above, the areas in which the elements described above are installed are surrounded by ground patterns and, further, ground patterns are provided in respective portions between terminals of the elements.

In the case of both the resistor R5 and the capacitor C58, a ground pattern is not provided in a portion between terminals thereof such that other ends of both the resistor R5 and the capacitor C58 form grounds.

The drain electrode of the transistor M3 is connected, through a through-hole N3, to both the wiring pattern of the third layer and the wiring pattern of the fourth layer. The wiring pattern of the third layer is connected, through a through-hole N4 and the wiring pattern of the first layer, to the other end of the resistor R4.

The other end (in other words, the pin Sw) of the capacitor C12 is connected, through a through-hole N5, to both the wiring pattern of the second layer and the wiring pattern of the fourth layer. The wiring patterns of both the second layer and the fourth layer are connected, through a through-hole N6, to both the source electrode of the transistor M3 and the drain electrode of the transistor M4 which are in the first layer. The wiring pattern of the fourth layer which is illustrated in FIG. 15 and connected, through the through-hole N5, to the other end of the capacitor C12 is connected, through a through-hole N7, to one end of the inductor L2 of the first layer.

Accordingly, portions between the through-hole N5 and the through-hole N6 are connected in parallel by the wiring patterns of the second layer and the fourth layer. A portion between the through-hole N6 and the through-hole N7 is connected by the wiring pattern of the fourth layer.

In the driving circuit 50, the transistors M3 and M4 are turned on/off (subjected to switching), and thus spike current of several amperes flows from the terminal Out as an output terminal to the ground, via the capacitor C10. As a result, noises due to the spike current are superimposed in the ground.

However, in this embodiment, the feedback wiring pattern Fb1 and the two paths of which one is the path extending, to the pin Vfb, from the through-hole N2 connected to the other end of the feedback wiring pattern Fb1 and the other is the path extending from the through-hole N2 to the pin Ifb are surrounded by ground patterns. Elements on the feedback path and elements of which one end is connected to the feedback path are operated with the ground as a reference portion. Thus, influence of the noise described above is reduced. Accordingly, in this embodiment, it is possible to generate and output the drive signal COM-A with high accuracy, in accordance with the signal Aa as a target signal while preventing operational failure due to the influence of the noise from occurring.

In the above description, the driving circuit 50 which generates the drive signal COM-A is exemplified. However, the driving circuit 50 which generates the drive signal COM-B has the same configuration as that of the driving circuit 50 for generating the drive signal COM-A. In the print circuit substrate, the driving circuit 50 for generating the drive signal COM-B and the driving circuit 50 for generating the drive signal COM-A have a pattern symmetric (except for a part of the wiring pattern and some through-holes) with respect to an imaginary reference line E (see FIGS. 16 to 18) connecting a $13_{th}$ pin and $36_{th}$ pin of the LSI 500, as can be understood from the partial views (in FIGS. 12 to 15) of the driving circuit 50 for generating the drive signal COM-B.

When the LSI 500 outputs gate signals for not only the drive signal COM-A but also for the drive signal COM-B, the data dA and the data dB are input, in a time-division manner, to, for example, the pins D0 to D9.

Next, the arrangement of the transistors M3 and M4 in the print circuit substrate will be described. In addition, the configuration of the transistor M3 (M4) will be described. Transistors having the same performance, for example, transistors having the same model-number, are used as the transistors M3 and M4.

Figure 20:
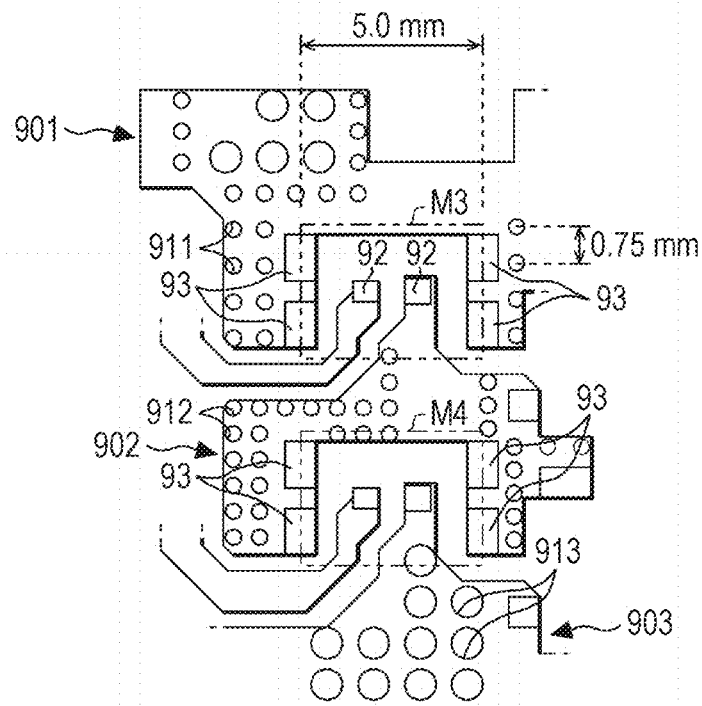
FIG. 20 is an enlarged view illustrating the vicinity of a transistor in the print circuit substrate.

FIG. 20 is a plan view illustrating the mounting positions of the transistors M3 and M4 in the print circuit substrate 90. In other words, FIG. 20 is a partially enlarged view of FIG. 12. Hatching lines are illustrated in FIG. 12. However, for clarity of illustration, hatching lines are omitted in FIG. 20.

A wiring pattern 901 includes four lands 93 to which the drain electrodes of the transistor M3 are connected, as illustrated in FIG. 20. A plurality of through-holes 911 are provided in the wiring pattern 901. The through-hole 911 has the same configuration as that of the through-hole N3 described above. The through-holes 911 allow the wiring pattern 901 of the first layer to be connected to both the wiring pattern of third layer (see FIG. 14) and the wiring pattern of the fourth layer (see FIG. 15). Furthermore, the voltage Vh is applied to the wiring pattern 901.

The drain electrode of the transistor M3 (or M4) has a function of an electrode and a function for dissipating heat of the transistor, as described below. Accordingly, the heat generated in the transistor M3 is transferred, via the drain electrode, to the wiring pattern 901 of the first layer. Furthermore, the heat generated in the transistor M3 is transferred, via the through-hole 911 (in other words, the through-hole N3), to both the wiring pattern of the third layer and the wiring pattern of the fourth layer. As a result, the heat is released by the wiring patterns described above.

A land 91 is provided to connect the gate electrode of the transistor M3 and a land 92 is provided to connect the source electrode of the transistor M3.

A wiring pattern 902 having the land 92 includes four lands 93 and a plurality of through-holes 912. The drain electrodes of the transistor M4 are connected to the four lands 93. The configuration of the through-hole 912 is the same as that of the through-hole N6 described above. The wiring pattern 902 of the first layer is connected, through the through-holes 912, to both the wiring pattern of the second layer and the wiring pattern of the fourth layer. A part of the wiring pattern 902 forms the terminal Out.

When the transistor M4 is mounted, the heat generated in the transistor M4 is transferred, via the drain electrode, to the wiring pattern 902 of the first layer. Furthermore, the heat generated in the transistor M3 is transferred, via the through-hole 912 (in other words, the through-hole N4), to both the wiring pattern of the second layer and the wiring pattern of the fourth layer. As a result, the heat is released by the wiring patterns described above.

The arrangement density of the through-holes 912 in the wiring pattern 902 is higher than that of the through-holes 911 in the wiring pattern 901. The reason for this is that the area of the wiring pattern 902 is smaller than that of the wiring pattern 901, as can be understood from FIG. 12 and the like.

Specifically, in the case of the wiring pattern 902, it is necessary to effectively transfer heat to the wiring patterns of the other layers.

The size of a gap between adjacent through-holes is as follows. In the case of the through-holes 911, the size of a gap is approximately 0.75 mm. In the case of the through-holes 912, the size of a gap is smaller than 0.75 mm. In the transistor M3 (or M4), a distance between drain electrodes (in other words, the lands 93) which face each other with both the gate electrode (in other words, the land 91) and the source electrode (in other words, the land 92) interposed therebetween is approximately 5.0 mm, as illustrated in FIG. 20. The thickness of the metal-plating of a through-hole is approximately 35 µm.

Figure 21:
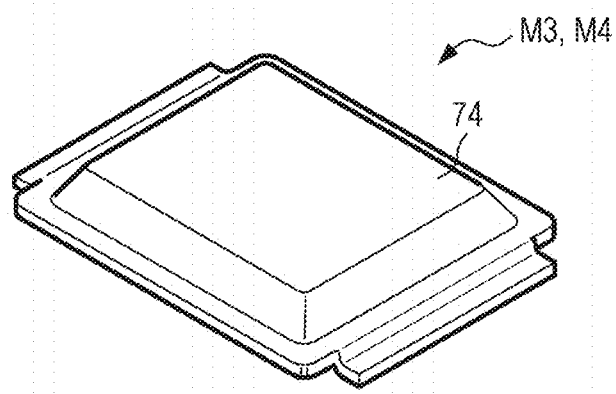
FIG. 21 is a perspective view illustrating the appearance of the transistor.
Figure 22A:
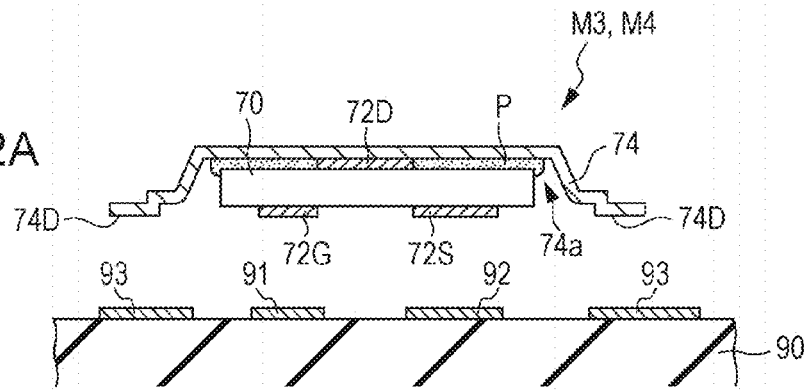
Figure 22B:
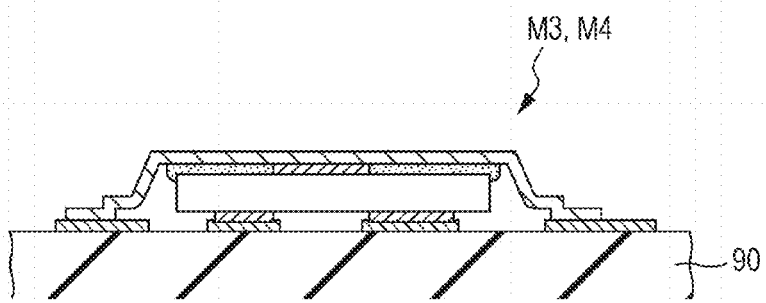

FIG. 21 is a perspective view illustrating the appearance of the transistor M3. FIGS. 22A and 22B are cross-sectional views illustrating the configurations of the transistor M3 and the likes.

The transistor M3 includes a die (in other words, a bare chip) 70 and a clip 74, as illustrated in FIGS. 21 to 22B. A drain pad (in other words, a first electrode) 72D is provided in the rear surface (which is the upper-side surface in FIGS. 21 to 22B) of the die 70. Both a gate pad (in other words, a second electrode) 72G and a source pad (in other words, a third electrode) 72S are provided in the mounting surface (which is the lower-side surface in FIGS. 21 to 22B) of the die 70.

The clip 74 has a rectangular shape, when viewed from the top. The clip 74 has an accommodation surface 74a which is dented toward a side opposite to the mounting surface side such that the die 70 is accommodated in the dented portion. The clip 74 is formed of a material, such as copper, having both favorable electric conductivity and thermal conductivity. The rear surface of the die 70 is bonded, using die-bonding agent P, to the accommodation surface 74a. Facing two sides of the clip 74 have fin shapes and the fin-shaped portions are terminals 74D.

Accordingly, in the transistor M3, the gate pad 72G functions as a gate electrode for allowing the transistor M3 to be connected to an external side, the source pad 72S functions as a source electrode, and the terminal 74D which is a part of the clip 74 functions as a drain electrode.

The position of the bottom surface of the terminal 74D of the clip 74 and the positions of the bottom surfaces of both the gate pad 72G and the source pad 72S of the die 70 are substantially aligned (such that the bottoms surfaces thereof are arranged in one plane). The above-described bottom surfaces of the transistor M3 are positioned with respect to a print circuit substrate 90 and are subjected to soldering, as illustrated in FIG. 22B. As a result, the gate pad 72G is connected to the land 91 as a second land of the print circuit substrate 90, the source pad 72S is connected to the land 92 as a third land of the print circuit substrate 90, and the terminal 74D is connected to the land 93 as a first land of the print circuit substrate 90.

When the transistor M3 is mounted on the print circuit substrate 90, the die 70 is covered by the clip 74 such that the die 70 is prevented from being exposed.

In the above description, the transistor M3 is exemplified. However, the configuration of the transistor M4 is the same as that of the transistor M3.

Figure 23:
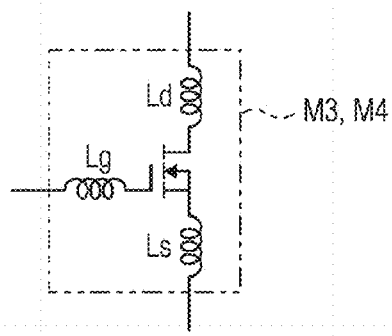
FIG. 23 is a view illustrating the equivalent circuit of the transistor.

FIG. 23 is a view illustrating the equivalent circuit of the transistor M3 (or M4). However, without being limited to the transistor M3 (or M4), the equivalent circuit of FIG. 23 is also a general equivalent circuit of a transistor. Parasitic inductance components exist in the respective electrodes of a transistor, in a series connection manner, as illustrated in FIG. 23. Specifically, in the transistor, a parasitic inductance $L_g$ exists in a gate electrode, a parasitic inductance $L_d$ exists in a drain electrode, and a parasitic inductance $L_s$ exists in a source electrode. Although both a parasitic resistance component and a parasitic capacitive component exist in each electrode of the transistor, the components are not illustrated in FIG. 23.

Figure 24A:
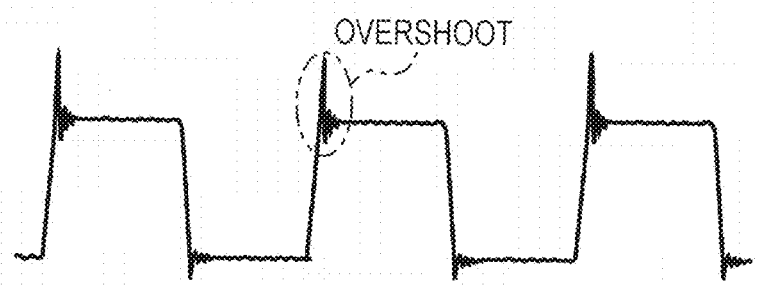
FIGS. 24A and 24B are views illustrating overshoot due to switching of the transistor.

When the transistors M3 and M4 are subjected to switching to generate the drive signal COM-A, as in the case of this embodiment, current steeply flows in a portion between the drain electrode and the source electrode or current is cut off. When a parasitic inductance, particularly, the inductance $L_d$ or the inductance $L_s$, in each electrode of the transistor M3 (or M4) is large, voltage noise, such as overshoot (or undershoot), occurs in the waveform of the voltage between the drain electrode and the source electrode, as illustrated in FIG. 24A.

When the sum of the inductance $L_d$ and the inductance $L_s$ is set to L, a voltage V between a drain electrode and the source electrode satisfies the relationship of $L(di/dt)$. As a result, the voltage noise is influenced by not only the inductance L but also by a frequency.

When the transistors M3 and M4 are subjected to switching at high frequency such that the drive signal COM-A (or COM-B) is generated with high accuracy, voltage is likely to easily occur. When such a voltage noise occurs, the noise components, along with regular pulse components, are smoothened by both the inductor L2 and the capacitor C10. Then, the smoothened noise components are input, through the feedback paths, to both the pin Vfb and the pin Ifb of the LSI 500. Accordingly, when the modulation signal Ms is generated, errors occur. Therefore, the transistors M3 and M4 are subjected to incorrect-switching (for example, double trigger in which both transistors are turned on at the same time). As a result, the accuracy of the waveform of the drive signal COM-A as an output signal is reduced and, further, electric power consumption increases in the driving circuit 50.

Figure 24B:
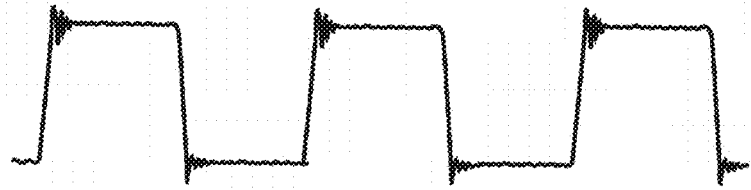

In the driving circuit 50 applied to the printing apparatus 1 of this embodiment, the gate pad 72G of the die is connected to the land 91 of the print circuit substrate 90 and the source pad 72S is connected to the land 92. In other words, the source electrode and the gate electrode of the die 70 are mounted to the print circuit substrate 90, in a face-down-bonding manner. Furthermore, the drain pad 72D is connected to the land 93 through the clip 74. Thus, upon comparison with a transistor of a type having a bonding wire and a lead, parasitic inductance components are reduced in respective electrodes of the transistor M3 (or M4). Therefore, overshoot or the like can be prevented from occurring, as illustrated in FIG. 24B. As a result, in the driving circuit 50, the accuracy of the waveform of the drive signal COM-A can be prevented from being reduced and, further, electric power consumption can be prevented from increasing.

Heat generated in the die 70 is directly transferred to the print circuit substrate 90 via the mounting surface and, further, the heat is transferred, through the clip 74, from the rear surface of the die 70 to the print circuit substrate 90. Then, the transferred heat is released by the print circuit substrate 90. In other words, heat generated in die 70, due to switching (in the strict sense, due to the current flowing at the time of turning on the transistor) is transferred to the print circuit substrate 90 via both surfaces of the die 70. As a result, the efficiency of transferring heat generated in the transistor M3 (or M4) increases.

Furthermore, in the print circuit substrate 90, the vicinities of the transistors M3 and M4 are connected, through the through-holes 911, 912, and 913 (see FIG. 20), to not only the wiring pattern of the first layer but also to the wiring patterns of the other layers. Specifically, the wiring pattern 901 connected to the drain electrode of the transistor M3 is connected, through the through-hole 911, to both the third layer and the fourth layer. The wiring pattern 902 connected to both the source electrode of the transistor M3 and the drain electrode of the transistor M4 is connected, through the through-hole 912, to both the second layer and the fourth layer. A wiring pattern 903 connected to the source electrode of the transistor M4 is connected, through a through-hole 913, to the ground patterns of the second layer, the third layer, and the fourth layer. As a result, heat dissipation efficiency is increased in the print circuit substrate 90.

When dots having different sizes are formed onto the printing medium P, it is necessary to reduce the time for performing two ink-droplet discharge actions. In other words, it is necessary to increase the ink discharge frequency f. Thus, heat and noise are likely to become problems. However, in this embodiment, heat and noise can be effectively prevented from occurring by, particularly, the transistors M3 and M4.

Next, the arrangement and the mounted state of the capacitor C10 in the print circuit substrate 90 will be described.

Figure 25:
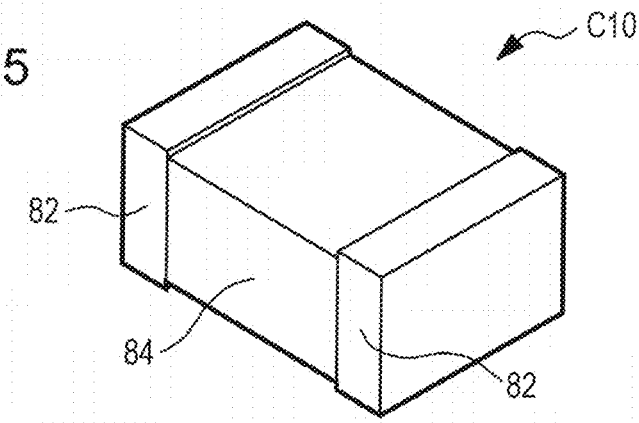
FIG. 25 is a view illustrating the configuration of a capacitor which constitutes a smoothing filter.
Figure 26:
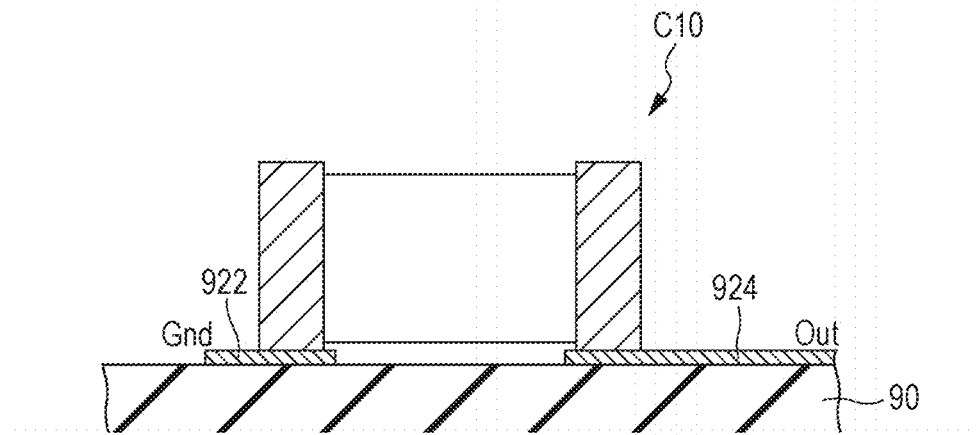

FIG. 25 is a perspective view illustrating the external configuration of the capacitor C10. FIG. 26 is an end view illustrating the mounted state of the capacitor C10.

The capacitor C10 is a so-called chip capacitor and is mounted on the front-surface of the print circuit substrate 90, as illustrated in FIGS. 25 and 26. The capacitor C10 has a configuration in which a dielectric body is interposed between two external electrodes 82. The internal configuration of the capacitor C10 is not illustrated in the accompanying drawings and, further, is not described in detail. However, a laminated ceramic chip capacitor in which, for example, dielectric layers and a pair of external electrodes 82 having a comb shape are laminated on one another, is used as the capacitor C10.

In the capacitor C10, one of the external electrodes 82 is connected to a land 924 in the wiring pattern including the terminal Out and the other is connected to a land 922 in the ground wiring pattern, as illustrated in FIG. 26.

Figure 27:
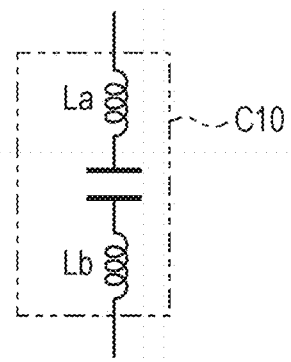
FIG. 27 is a view illustrating the equivalent circuit of the capacitor.

FIG. 27 is a view illustrating the equivalent circuit of the capacitor C10. However, without being limited to the capacitor C10, the equivalent circuit of FIG. 27 is also a general equivalent circuit of a capacitor.

Parasitic inductances La and Lb exist in respective electrodes of a capacitor, in a series connection manner, as illustrated in FIG. 27. Although both a parasitic resistance component and a parasitic capacitive component exist in each electrode of the capacitor, the components are not illustrated in FIG. 27.

The capacitor C10, along with the inductor L2, smoothen the amplified modulation signal, in other words, switching current, generated in the connection point (in other words, the pin Sw) between the transistor M3 and the transistor M4. Accordingly, when the parasitic inductance component is large in the capacitor C10, similarly to in the case of the transistor M3 or M4, voltage noise, such as overshoot, occurs. When the voltage noise is input, through the feedback paths, to both the pin Vfb and the pin Ifb of the LSI 500, the transistors M3 and M4 are subjected to incorrect-switching. As a result, similarly to in the case of the transistors M3 and M4, the accuracy of the waveform of the drive signal COM-A is reduced and, further, electric power consumption increases in the driving circuit 50.

In the driving circuit 50 applied to the printing apparatus 1, the capacitor C10 is a leadless type capacitor, in other words, a leadless-type chip capacitor. One of the two external electrodes 82 is connected, in a soldering manner, to the land 922 of the print circuit substrate 90 and the other is connected, in a soldering manner, to the land 924. Accordingly, upon comparison with a capacitor of a type having a lead, the inductances La and Lb are reduced in the capacitor C10. Therefore, overshoot or the like can be prevented from occurring. As a result, the accuracy of the waveform of the drive signal COM-A can be prevented from being reduced and, further, electric power consumption can be prevented from increasing.

In the print circuit substrate 90, the capacitor C10 is arranged as follows. When the capacitor C10 is viewed from the top, as illustrated in FIG. 16, the capacitor C10 is mounted on the print circuit substrate 90, in a state where an imaginary line F connecting the pair of external electrodes 82 of the capacitor C10 is substantially parallel to the line E.

In the two external electrodes 82, the external electrode 82 connected to the land 922 of the ground pattern is located further in the LSI 500 side than the external electrode 82 connected to the terminal Out. In the two lands of the print circuit substrate 90, which are the lands connected to the capacitor C10, the land 922 of the ground pattern is located, in the driving circuit 50, closer to the LSI 500, compared to the land 924 which functions as an output terminal. As a result, the impedance of the ground pattern extending from the land 922 to the LSI 500 is reduced.

In the driving circuit 50, the transistors M3 and M4 are subjected to switching, and thus spike current of several amperes flows to the ground, as described above. As a result, noises due to the spike current are superimposed in the ground. However, in this embodiment, the impedance of the ground pattern extending from the land 922 to the LSI 500 is reduced, and thus the influence by the noises can be prevented.

The invention is not intended to be limited by the embodiment described above. The invention can be modified in various ways. One or more selected from the modification examples described below can be used alone or in combination.

In the this embodiment, the driving circuit 50 has a configuration in which, when the modulation signal Ms is generated, the drive signal COM-A (or COM-B) which is obtained by smoothening the amplified modulation signal by the low pass filter is fed back. However, the driving circuit 50 may have a configuration in which the modulation signal Ms itself is fed back. Although not illustrated, a difference between the modulation signal Ms and the signal As is calculated, and then a signal delayed by the difference and the signal Aa as a target signal are subjected to addition or subtraction to obtain a signal. The obtained signal may be used as an input signal of the comparator 520.

The only difference between the amplified modulation signal generated in the connection point (in other words, the pin Sw) between the transistor M3 and the transistor M4 and the modulation signal Ms is logic amplitude. Thus, the amplified modulation signal is subjected to attenuation, and then the attenuated amplified modulation signal may be fed back, similarly to in the case of the modulation signal Ms.

In the embodiment, the print circuit substrate 90 is constituted of the four layers. However, the print circuit substrate 90 may be constituted of layers, for example, six layers, other than four layers. When the print circuit substrate 90 is constituted of six layers, the feedback wiring pattern Fbl may be formed in, for example, a fourth layer, in a state where the feedback wiring pattern Fbl is surrounded by a ground pattern, and ground patterns may be formed in both a third layer and a fifth layer. In this case, ground patterns may be formed in, in addition to the third layer and the fifth layer, a second layer and a sixth layer.

In the embodiment, the drive signal COM-A and the drive signal COM-B are separately generated by the two driving circuits 50. Next, either the drive signal COM-A or the drive signal COM-B (or neither signal) is selected by the selection portion 230, and then the selected signal is supplied to one end of the piezoelectric element 60. However, for example, four trapezoidal waveforms are repeated in one drive signal and one or more waveforms may be supplied, alone or in combination, to one end of the piezoelectric element 60 in accordance with the size of the dot, which is defined by the data signal Data.

What is claimed is:

1. A liquid discharging apparatus comprising:
   an integrated circuit including a modulation circuit that generates a modulation signal that is obtained by pulse-modulating a source signal;
   a transistor that generates an amplified modulation signal by amplifying the modulation signal;
   a low pass filter that includes an inductor and a capacitor and generates a drive signal by smoothening the amplified modulation signal;
   a piezoelectric element that is displaced by receiving the drive signal;
   a cavity of which the internal volume changes in accordance with the displacement of the piezoelectric element;
   a nozzle through which liquid in the cavity is discharged in accordance with change in the internal volume of the cavity; and
   a circuit substrate on which the integrated circuit, the transistor, and the low pass filter are mounted, wherein
   the capacitor is a leadless type capacitor and includes a first electrode and a second electrode,
   the integrated circuit and the first electrode are connected to a ground pattern, and
   a distance of the integrated circuit and the first electrode of the capacitor is smaller than a distance of the integrated circuit and the second electrode of the capacitor.

2. The liquid discharging apparatus according to claim 1, wherein the frequency of the modulation signal is in the range of 1 MHz to 8 MHz.

3. The liquid discharging apparatus according to claim 1, wherein a signal based on the modulation signal, the amplified modulation signal, or the drive signal is fed back to the modulation circuit, in such a manner that the modulation circuit generates the modulation signal.

4. The liquid discharging apparatus according to claim 1 wherein the ground pattern and an output terminal pattern are provided on the circuit substrate, and the second electrode of the capacitor and one end of the inductor are connected to the output terminal pattern.

5. The liquid discharging apparatus according to claim 1 further comprising:
   an output terminal pattern, wherein the output terminal pattern and the ground pattern are provided on the circuit substrate;
   a first land connected to the first electrode of the capacitor, wherein the first electrode is connected to the ground pattern via the first land; and
   a second land connected to the second electrode of the capacitor, wherein the second electrode is connected to the output terminal pattern via the second land.

6. A head unit comprising:
   a piezoelectric element that is displaced by receiving a drive signal;
   a cavity of which the internal volume changes in accordance with the displacement of the piezoelectric element; and
   a nozzle through which liquid in the cavity is discharged in accordance with change in the internal volume of the cavity,
   wherein the drive signal is obtained by smoothening an amplified modulation signal by a low pass filter including an inductor and a capacitor,
   wherein the amplified modulation signal is obtained by amplifying a modulation signal by a transistor,
   wherein the modulation signal is obtained by pulse-modulating a source signal by an integrated circuit includes a modulation circuit,
   wherein the integrated circuit, the transistor, and the low pass filter are mounted on a circuit substrate, and
   wherein the capacitor is a leadless type capacitor and includes a first electrode and a second electrode,
   wherein the integrated circuit and the first electrode are connected to a ground pattern,
   wherein one end of the inductor and the second electrode of the capacitor are connected to an output terminal pattern; and
   wherein a distance of the integrated circuit and the first electrode of the capacitor is smaller than a distance of the integrated circuit and the second electrode of the capacitor.

7. A control method of a liquid discharging apparatus that has a piezoelectric element that is displaced by receiving a drive signal, a cavity of which the internal volume changes in accordance with the displacement of the piezoelectric element, and a nozzle through which liquid in the cavity is discharged in accordance with change in the internal volume of the cavity,
   wherein an integrated circuit, a transistor, and a low pass filter are mounted on a circuit substrate,
   wherein the integrated circuit includes the modulation circuit generates a modulation signal that is obtained by pulse-modulating a source signal,
   wherein the transistor generates an amplified modulation signal by amplifying the modulation signal,
   wherein the low pass filter generates the drive signal by smoothening the amplified modulation signal using an inductor and a capacitor, and
   wherein the capacitor is a leadless type capacitor and includes a first electrode and a second electrode,
   wherein the integrated circuit and the first electrode are connected to a ground pattern, and
   wherein a distance of the integrated circuit and the first electrode of the capacitor is smaller than a distance of the integrated circuit and a second electrode of the capacitor.

* * * * *